United States Patent [19]
Ishikawa et al.

[11] Patent Number: 5,160,993
[45] Date of Patent: Nov. 3, 1992

[54] HIGH SPEED OPTOSEMICONDUCTOR DEVICE HAVING MULTIPLE QUANTUM WELLS

[75] Inventors: Hideaki Ishikawa, Hadano; Yoshihiro Sugiyama, Atsugi; Shunichi Muto, Atsugi; Toshio Fujii, Atsugi, all of Japan

[73] Assignee: Fujitsu Limited, Kawasaki, Japan

[21] Appl. No.: 711,548

[22] Filed: Jun. 6, 1991

[30] Foreign Application Priority Data

Jun. 6, 1990 [JP] Japan .................................. 2-147897
Jul. 3, 1990 [JP] Japan .................................. 2-175846
Feb. 20, 1991 [JP] Japan .................................. 3-26509

[51] Int. Cl.⁵ ............................................ H01L 27/14
[52] U.S. Cl. .................................... 257/14; 359/248; 359/246; 359/260; 257/184
[58] Field of Search ................ 357/4, 16, 30 E, 19, 357/58; 359/248, 246, 251, 260, 276, 245

[56] References Cited

U.S. PATENT DOCUMENTS

| | | | |
|---|---|---|---|
| 4,720,309 | 1/1988 | Deveaud et al. | 148/33.1 |
| 4,745,452 | 5/1988 | Sollner | 357/30 E |
| 4,819,036 | 4/1989 | Kuroda et al. | 357/30 E X |
| 4,903,101 | 2/1990 | Maserjian | 357/4 X |
| 5,036,371 | 7/1991 | Schwartz | 357/4 X |

FOREIGN PATENT DOCUMENTS 61-212823 9/1986 Japan .

OTHER PUBLICATIONS

Migus et al., "One-Picosecond Optical NOR Gate at Room Temperature with a GaAs-AlGaAs Multiple-Quantum-Well Nonlinear Fabry-Perot Etalon", *Appl. Phys. Lett.*, 46(1), Jan. 1, 1985, pp. 70-72.

Atsushi Tackeuchi et al.: "Fast Recovery of Excitonic Absorption Peaks in Tunneling Bi-Quantum-Well Structures", *Japanese Journal of Applied Physics*, vol. 28, No. 7, Jul. 1989, pp. L1098-L1100.

*Primary Examiner*—William Mintel
*Attorney, Agent, or Firm*—Staas & Halsey

[57] ABSTRACT

In an optosemiconductor device including a superlattice configuration (TBQ) of first and second quantum well layers and a potential barrier therebetween, photo-excited carriers are formed in the first quantum well layer and are tunnelled through the potential barrier toward the second quantum well layer, so that the tunneled carriers are accumulated in the second quantum well layer. An electric field is applied to the superlattice configuration to expel the tunneled carriers from the second quantum well layer.

24 Claims, 25 Drawing Sheets

PULSEWIDTH=100fs
POWER=10μW
f = 100MHz

PULSEWIDTH=100fs
POWER=10mW
f = 100MHz

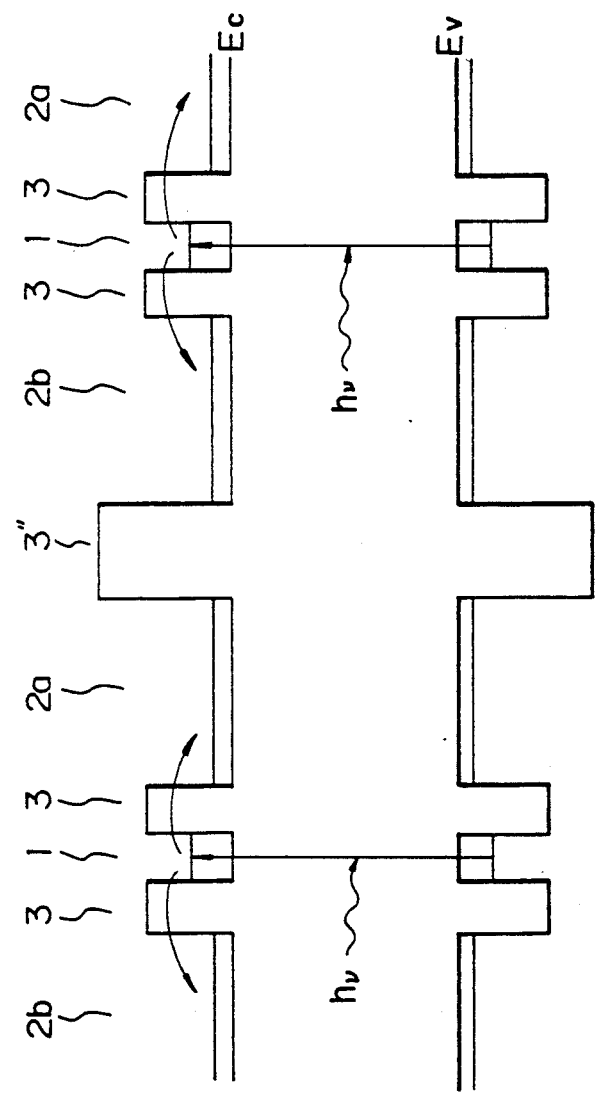

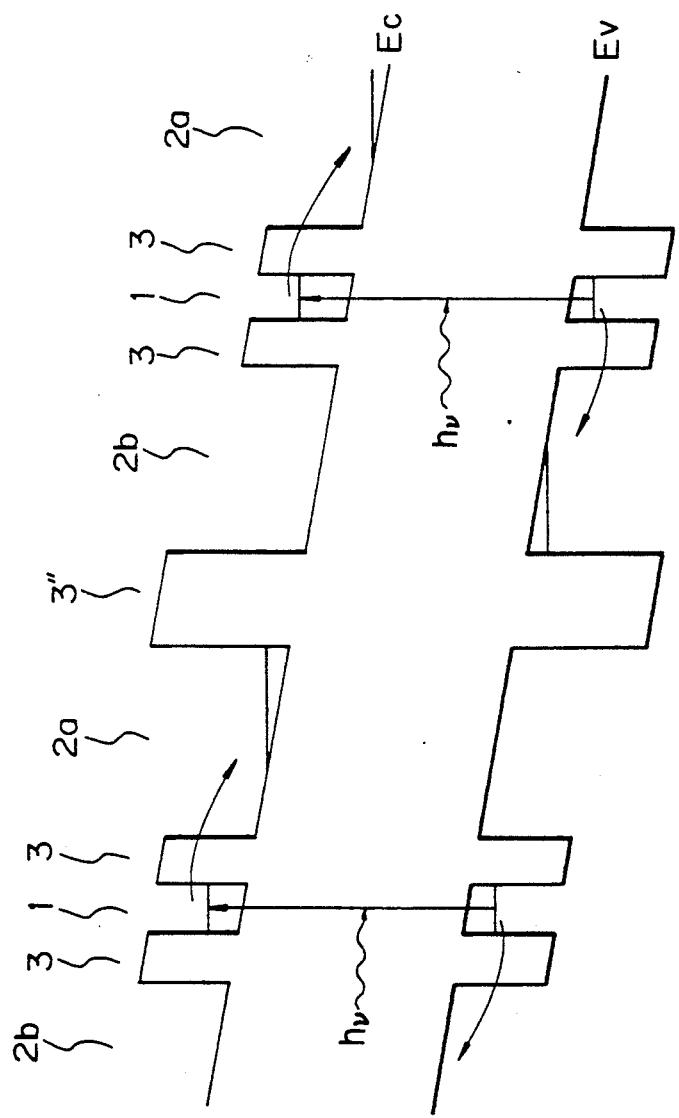

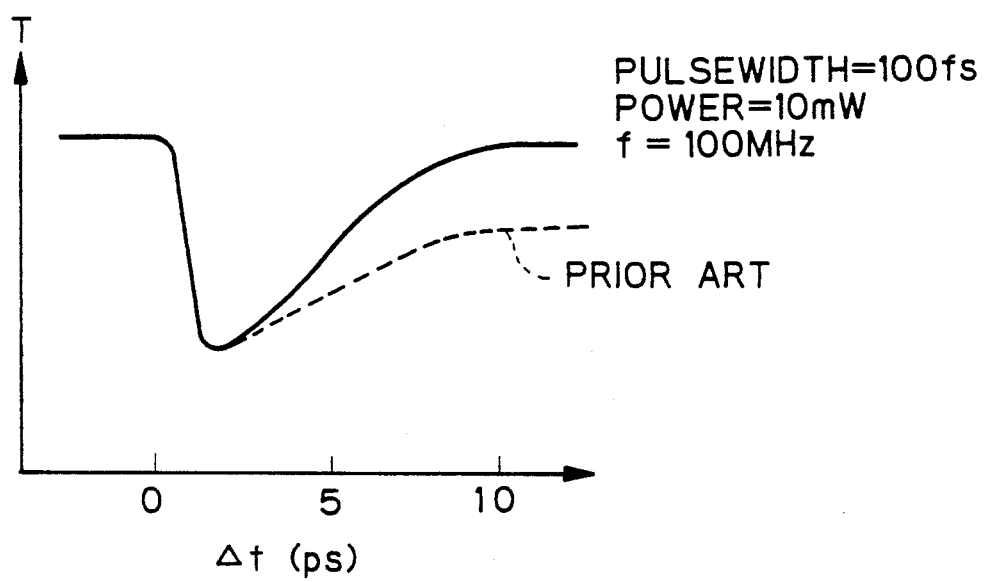

HIGH SPEED OPTOSEMICONDUCTOR DEVICE HAVING MULTIPLE QUANTUM WELLS

BACKGROUND OF THE INVENTION

1. Field of the Invention

The present invention relates to an optosemiconductor device having a superlattice configuration in which photo-excited carriers (excitons) are generated to change the transmission (or absorption) of light through the superlattice configuration. The optosemiconductor device can be used as an optical switch, optical bistable device, and optical memory in a high speed optical communication system and a high speed optical computer.

2. Description of the Related Art

The nonlinear properties of the transmission, absorption, and refraction of a superlattice configuration by excitons in multiple quantum wells (MQWs) are applied to high speed optical devices.

A prior art GaAs/AlGaAs MQW is formed by a superlattice configuration consisting of GaAs quantum wells and AlGaAs potential barriers in stacked films (see: A. Migus et al., "One-picosecond NOR gate at room temperature with a GaAs/AlGaAs multiple-quantum-well nonlinear Fabry-Perot etalon", Appl. Phys. Lett. 46 (1985) 70). Note, this GaAs/AlGaAs MQW includes only one kind of quantum well. In this MQW, if a light beam having a wavelength $\lambda$ corresponding to an electron energy level in the GaAs quantum wells is exposed to the MQW and satisfies a resonant tunneling condition:

$$m \lambda/2 = n L \quad (1)$$

wherein n is a refractive index of the MQW;

L is a length of the MQW; and m is an integer, a resonant tunneling phenomenon occurs, i.e., the absorption ratio of such a light beam by the MQW is remarkably reduced (i.e., the transmission ratio of such a light beam is remarkably increased), and this means that the light beam passes through the MQW.

When a next light beam having the same wavelength $\lambda$ is immediately made incident on the MQW, little of this light beam passes through the MQW, since the refractive index of the MQW is changed by the excitons in the quantum wells formed by the previous light beam and the Coulomb interactions between tunneled electrons. Nevertheless, when a sufficient time such as 30 ns has passed, the electron-hole pairs of the excitons are recombined, and thus another light beam can pass through the MQW.

Namely, the transmission ratio of a light beam of the MQW is initially quickly reduced but the transmission ratio of a light beam of the MQW is evenutally slowly increased, since a recovery time of the MQW is dependent mainly upon the recombination of electron-hole pairs of excitons formed in the quantum wells.

To reduce the recovery time, a new super-lattice configuration, called a "tunneling bi-quantum-well" (TBQ) configuration, has been suggested (see: Atsushi Tackeuchi et al.: "Fast Recovery of Excitonic Absorption Peaks in Tunneling Bi-Quantum-Well Structures", JJAP, vol. 28, No. 7, 1989, pp. L 1098–L1100). In this TBQ configuration, narrow and wide quantum wells are coupled by potential barriers, and the quantum energy levels of the narrow and wide quantum wells are different. For example, the height of a quantum energy level of the narrow quantum wells is higher than that of a quantum energy level of the wide quantum wells. When a light beam having a wavelength corresponding to a quantum energy level of the narrow quantum wells is made incident on the TBQ configuration, excitons are formed in the narrow quantum wells to reduce the transmission ratio of a light beam. In the TBQ configuration, the excitons formed in the narrow quantum wells are tunneled through the potential barriers to the wide quantum wells and thus the excitons formed in the narrow quantum wells disappear therefrom due to the tunneling of electrons and holes toward the wide quantum wells, in addition to the recombination of electron-hole pairs of the excitons. Accordingly, a recovery time of the transmission ratio can be shortened, for example, to on the order of 10 ps, to thereby enable a rapid switching of a light beam. The TQB configuration will be explained later in more detail.

In the above-mentioned TBQ configuration, however, the recovery time is still not satisfactory.

SUMMARY OF THE INVENTION

An object of the present invention is to further reduce a recovery time of the optosemiconductor device.

According to the present invention, in an optosemiconductor device including a superlattice configuration of first and second quantum well layers and having a potential barrier therebetween, photo-excited carriers are formed in the first quantum well layer and are turned through the potential barrier toward the second quantum well layer, so that the tunneled carriers are accumulated in the second quantum well layer. An electric field is applied to the superlattice configuration to expel the tunneled carriers from the second quantum well layer, whereby the reduction of the excitons in the first quantum well is enhanced to thus reduce the recovery time.

According to another aspect of the present invention, the above-mentioned second quantum well layer is formed by two quantum wells forming a broken gap type heterojunction. As a result, the tunneled electrons and holes are recombined with each other at the broken gap type heterojunction, which enhances the reduction of the photo-excited carriers (excitons) in the first quantum well layer, to thus reduce the recovery time.

BRIEF DESCRIPTION OF THE DRAWINGS

The present invention will be more clearly understood from the description as set forth below, with reference to the accompanying drawings, wherein:

FIGS. 11A, 11B, and FIG. 11C are energy band diagrams explaining the operation of the device of FIG. 10;

FIG. 20 is a graph showing a recovery time of the device of FIG. 17;

DESCRIPTION OF THE PREFERRED EMBODIMENTS

Before the description of embodiments of the present invention, a prior art TBQ configuration will be explained in detail with reference to FIGS. 1, 2A, 2B, 3A, and 3B.

Figure 1:
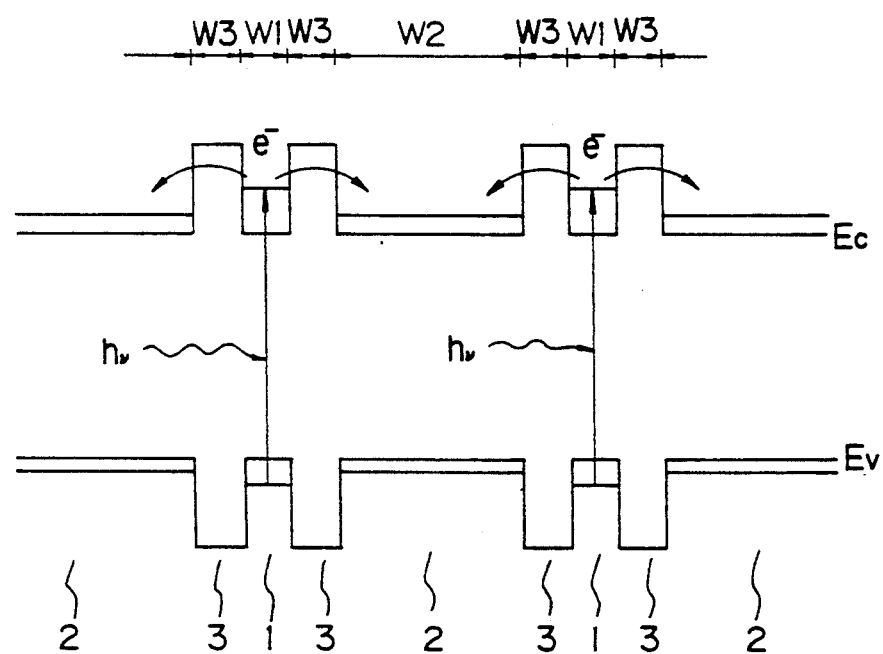
FIG. 1 is an energy band diagram illustrating a prior art TBQ configuration.

In FIG. 1, which is an energy band diagram illustrating a prior art TBQ configuration, GaAs narrow quantum wells 1 having a thickness W1 of 4.5 nm and GaAs wide quantum wells 2 having a width W2 of 9.0 nm are sandwiched by AlGaAs potential barriers 3 having a width W3 of 4.0 nm. For example, the TBQ configuration consists of 120 periods of one GaAs narrow well 1, one GaAs wide well 2, and two potential barriers 3.

Figure 3A:
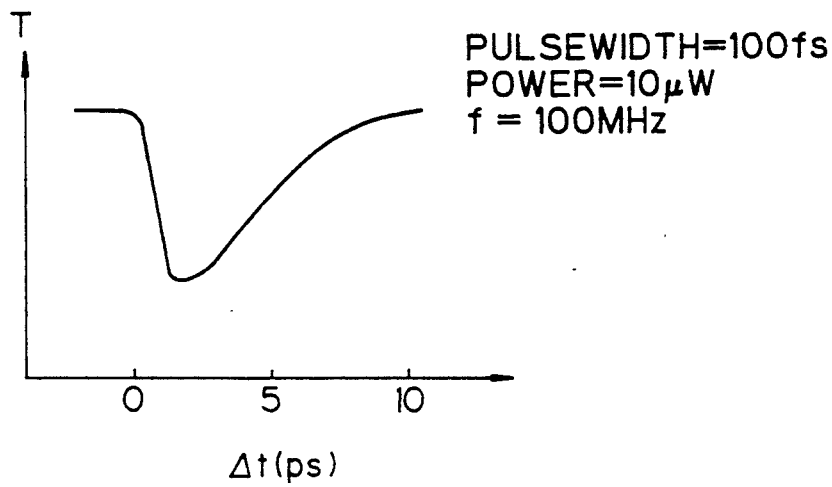
FIGS. 3A and 3B are graphs showing a recovery time of the prior art TBQ configuration of FIGS. 1, 2A and 2B.

As illustrated in FIG. 1, the energy levels of the GaAs narrow quantum well 1 and the GaAs wide quantum well 2 are different, i.e., the height of an electron energy level of the GaAs narrow quantum well 1 is higher than that of its corresponding electron energy level of the GaAs wide quantum well 2, since the width W1 of the narrow quantum well 1 is smaller than the width W2 of the wide quantum well 2. Therefore, after excitons are formed in the narrow quantum well 1 by receiving a light beam as indicated by $h\nu$, electrons in the narrow quantum well 1 can quantum-mechanically tunnel toward the wide quantum well 2. Therefore, after a light beam $h\theta$ having resonant wavelength $\lambda$ is made incident on the TBQ configuration, a time for a recovery to the initial refractive index state is very short. Therefore, if the difference in time between a first light beam $h\nu$ (called a control light beam) and a second light beam $h\nu$ (called a signal light beam) is $\Delta t$ and the transmission of the signal light beam is T, the relationship between $\Delta t$ and T is as shown in FIG. 3A. Namely, the transmission T is remarkably reduced and is also remarkably increased. Note that FIG. 3A shows the case wherein a pulse width of the control light beam C is 100 fs, the power thereof is relatively low, for example, 10 $\mu$W, and the frequency thereof is 100 MHz.

Figure 2A:
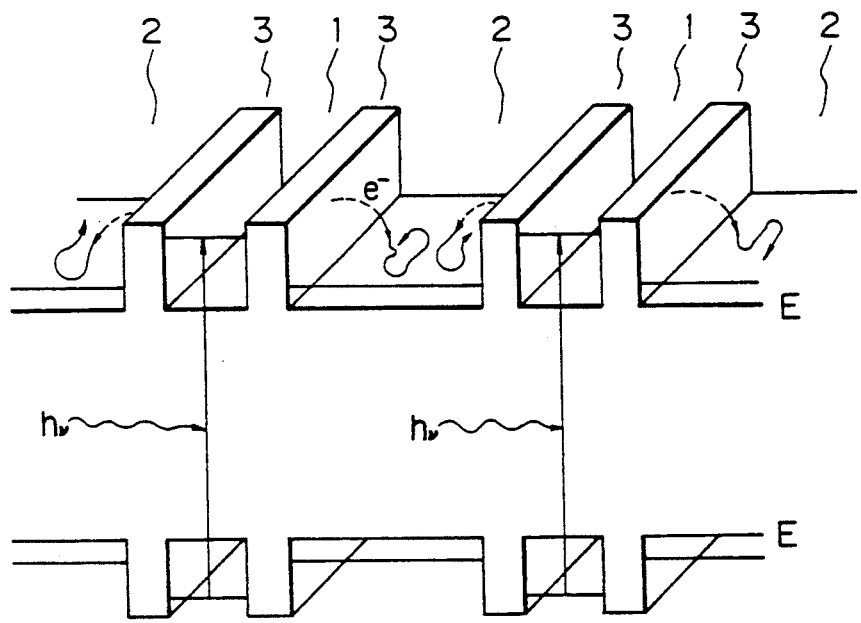
FIGS. 2A and 2B are energy band diagrams illustrating a prior art TBQ configuration.
Figure 2B:
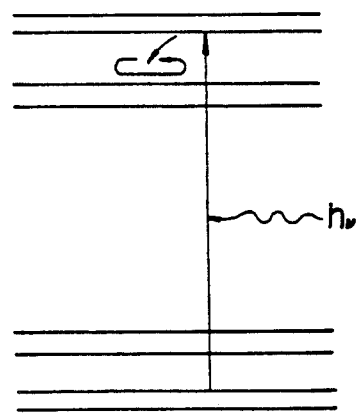
Figure 3B:
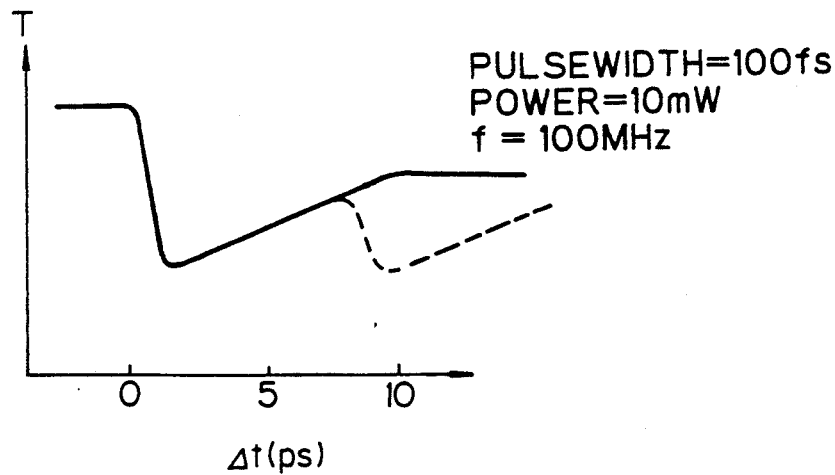

When the peak intensity of the light beams is increased, however, electrons (and holes) tunneled to the wide quantum well 2 occupy the state density of a corresponding energy level, and that the electrons (holes) remain as illustrated in FIGS. 2A and 2B. This is because a recombination time of electrons and holes is remarkably larger than a tunneling time of electrons and holes through the potential barrier 3. Also, since a hole has a larger effective mass than an electron, the spread of a wavefunction of a hole is smaller than that of a wavefunction of an electron. Therefore, the tunneling speed of holes through the potential barrier 3 is slow. As a result, the quasi-Fermi level of the wide quantum well 2 is substantially the same as the Fermi level of the narrow quantum well 1, and therefore, in this case, a tunneling phenomenon is no longer carried out, and thus, as shown in FIG. 3B, the recovery time is relatively long, for example, several nanoseconds. Note that FIG. 3B shows the case wherein a pulse width of the control light beam C is 100 fs, the power thereof is relatively high, for example, 10 mW, and the frequency thereof is 100 MHz.

In FIG. 3B, a dotted line indicates the case wherein the next light beam is made incident before the transmission ratio is recovered.

Figure 4:
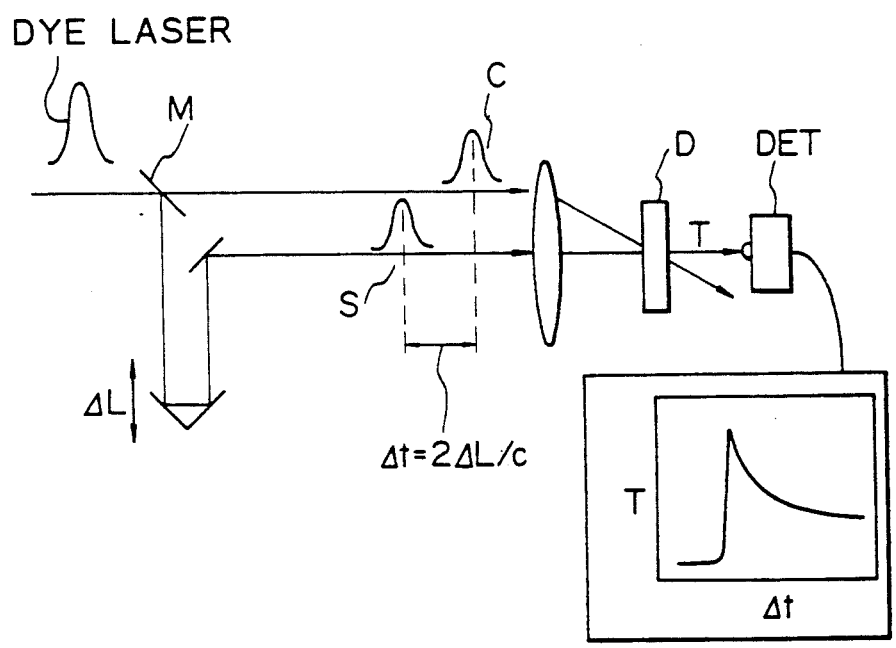
FIG. 4 is a diagram illustrating a recovery time measuring apparatus.

Note that the recovery time is measured by a recovery time measuring apparatus as illustrated in FIG. 4. In FIG. 4, a pump-probe method is used, i.e., a dye laser beam excited by a YAG laser is split into a pump light beam (control light beam) C and a probe light beam (signal light beam) S at a half mirror M. The control light beam C is made incident directly onto an optosemiconductor device D, and the signal light beam S is made incident, via a time delay means having an optical path $\Delta L$, onto the optosemiconductor device D. A detector (such as a photo diode) DET detects the intensity of a transmission light T through the optosemiconductor device D. In this case, the difference $\Delta t$ in time between the control light beam C and the signal light beam S is represented by $2\Delta L/c$, and therefore, the relationship between $\Delta t$ and T can be obtained by changing the optical path $\Delta L$.

Figure 5:
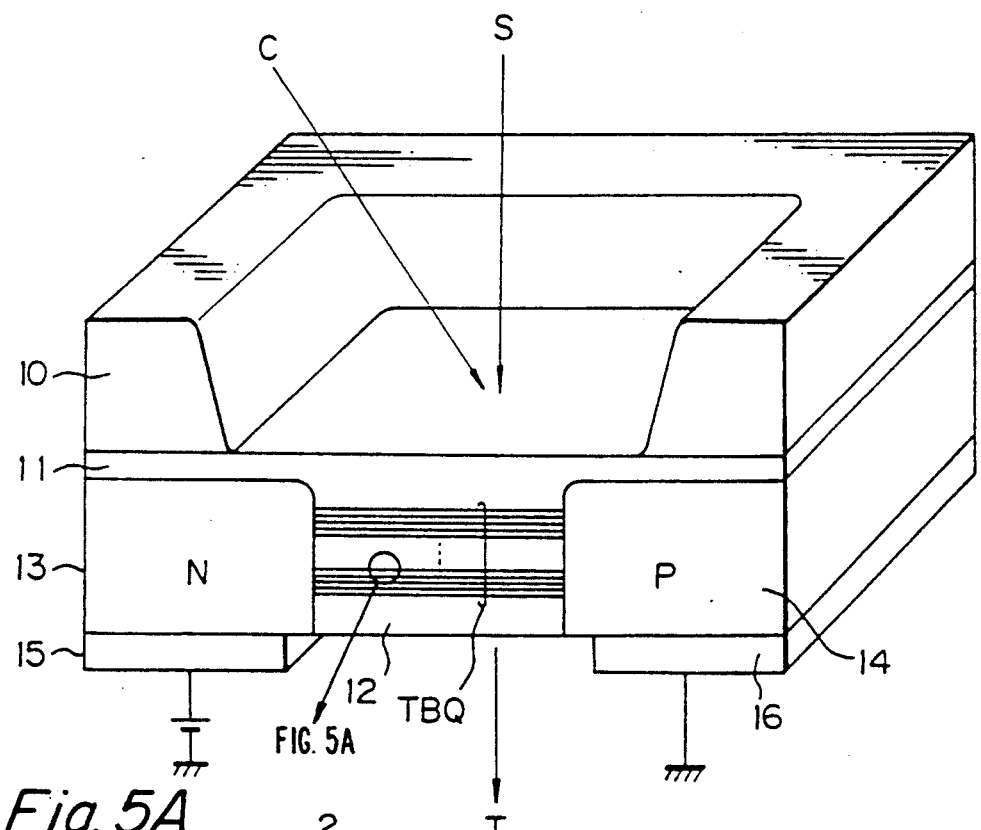
FIGS. 5 and 5A are cross-sectional views illustrating a first embodiment of the optosemiconductor device according to the present invention.
Figure 5A:
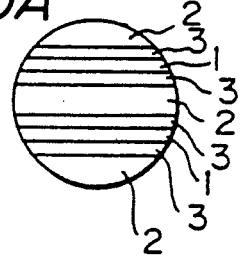

In FIGS. 5 and 5A, which show a first embodiment of the present invention, reference numeral 10 designates a semi-insulating GaAs substrate which has an opening for irradiating a control light beam C and a signal light beam S therein. In this case, the GaAs substrate 10 is about 100 $\mu$m thick. Reference numeral 11 designates a AlGaAs buffer layer and 12 designates an AlGaAs protection layer. A TBQ configuration is sandwiched by the AlGaAs buffer layer 11 and the AlGaAs protection layer 12. The total thickness of the AlGaAs buffer layer 11, the TBQ configuration, and the AlGaAs protection layer 12 is about 5 μm.

As explained above, the TBQ configuration consists of 120 periods of one 4.5 nm thick GaAs narrow quantum well 1, one 4.0 nm thick AlGaAs potential barrier 3, one 9.0 nm thick GaAs wide quantum well 2, and one 9.0 nm thick AlGaAs potential barrier 3. The TBQ configuration is about 10 μm wide and about 30 μm deep.

According to the present invention, an about 10 μm wide N-type contact region 13 and an about 10 μm wide P-type contact region 14 are provided to connect to an AuGe/Au electrode layer 15 and an Au/Zn/Au electrode layer 16, respectively. A positive voltage is applied to the AuGe/Au electrode layer 15, and a negative voltage (or the ground) is applied to the Au/Zn/Au electrode layer 16, thereby applying an electric field to the TBQ configuration. Note, preferably such an electric field is less than about $1 \times 10^6$ V/m, since the application of too strong an electric field to the TBQ application destroys excitons formed in the narrow quantum wells 1, by ionization (see: Chemla et al., Applied Physics Letter, vol. 42, p. 864 (1983), & Miller et al., Physical Review, vol B32, p. 1043 (1985)).

Figure 6A:
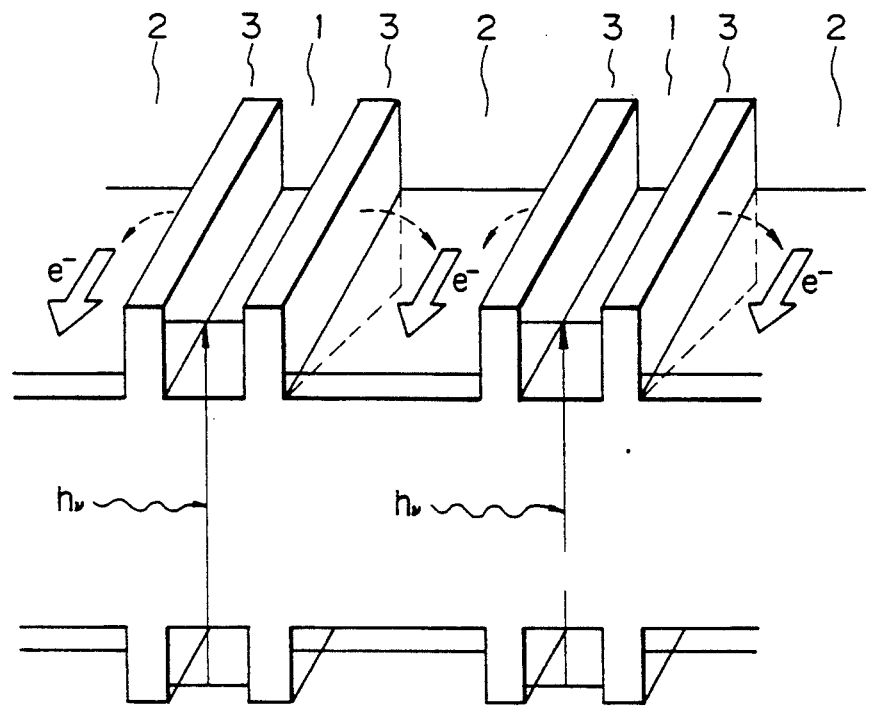
FIGS. 6A and 6B are energy band diagrams explaining the operation of the device of FIG. 5.
Figure 6B:
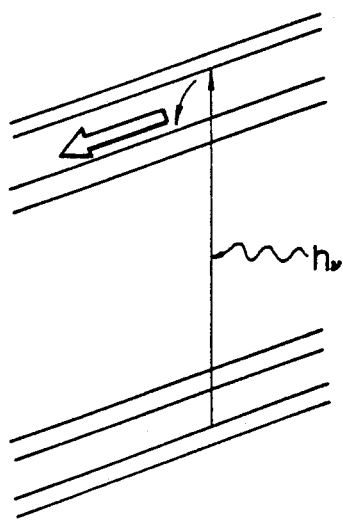

As illustrated in FIGS. 6A and 6B, although the energy band is sloped, photo-excited carriers (excitons) in the narrow quantum well 1 are not ionized. In this state, the bound energy of the excitons is effectively weakened and the wavefunction thereof spread over the wide quantum well 2, and therefore, the electrons and holes of the excitons are tunneled through the potential barrier 3 to the wide quantum well 2. Then, electrons in the wide quantum wells 2 are accelerated at a high speed as indicated by arrows, and therefore, the electrons in the wide quantum wells are expelled therefrom. The same is true for holes in the wide quantum wells, and thus a recovery of excitonic absorption can be rapidly attained.

Also, the P-type contact region 14, the TBQ configuration, and the N-type contact region 13 form a PIN configuration, to thereby bend the energy band within the TBQ configuration without applying an electric field thereto. Therefore, the electrons and holes in the wide quantum wells 2 can be expelled therefrom by using such a PIN configuration.

Figure 7A:
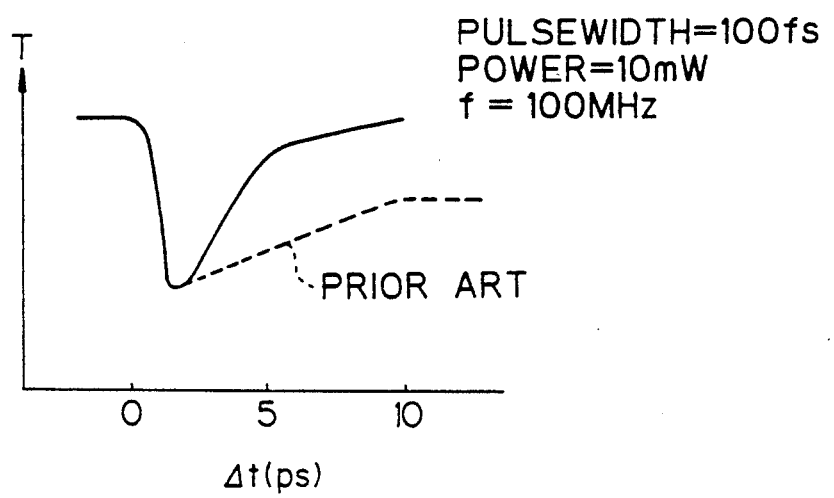
FIGS. 7A and 7B are graphs showing a recovery time of the device of FIG. 5.
Figure 7B:
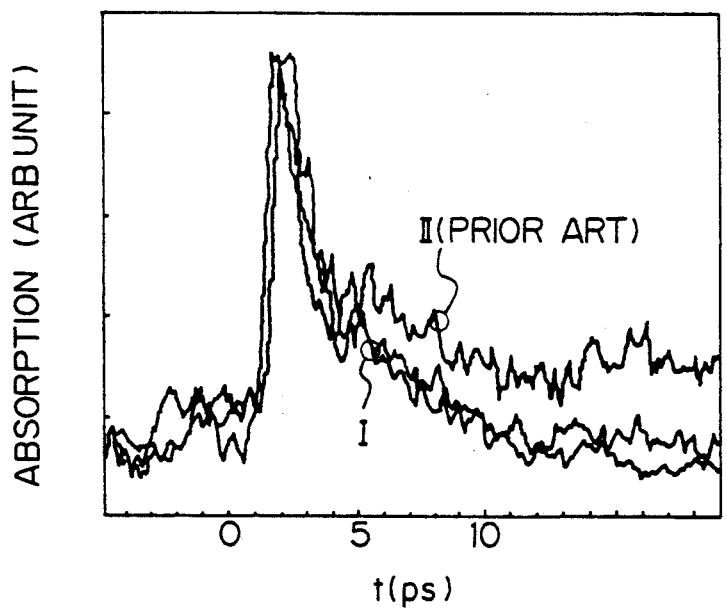

The recovery time when using the optosemiconductor device of FIG. 5 is improved for a relatively high power of the control light beam C such as 10 mW as shown in FIG. 7A. FIG. 7B shows an actual recovery time characteristic where the N-type and P-type regions 13 and 14 are not provided, and an electric field is applied to the TBQ configuration.

The optosemiconductor device of FIG. 5 is manufactured by the crystal growth of the AlGaAs buffer layer 11, the TBQ configuration, and the AlGaAs protection layer 12 on the GaAs substrate 10 using a molecular beam epitaxy (MBE) method. Note that the TBQ configuration can also be formed by using a metal organic chemical vapor deposition (MOCVD) method.

Next, the N-type contact region 13 is formed by depositing silicon (Si) using an electron beam (EB) evaporation with a mask of silicon nitride ($Si_3N_4$), and further, thermally doping silicon therein. Similarly, the P-type contact region 14 is formed by depositing zinc (Zn) using EB evaporation with a mask of silicon nitride ($Si_3N_4$), and further thermally doping zinc therein. Note that the N-type contact region 13 and the P-type contact region 14 can also be formed by doping dopants such as silicon or zinc by using a focused ion beam and annealing thereafter.

Next, the GaAs substrate 10 is selectively chemical-etched to partially expose the AlGaAs buffer layer 11, and then a metal layer such as AuGe/Au or Au/Zn/Au is deposited on the N-type contact region 13 and the P-type contact region 14 to obtain the electrode layers 15 and 16, thus completing the device of FIG. 5.

Figure 8:
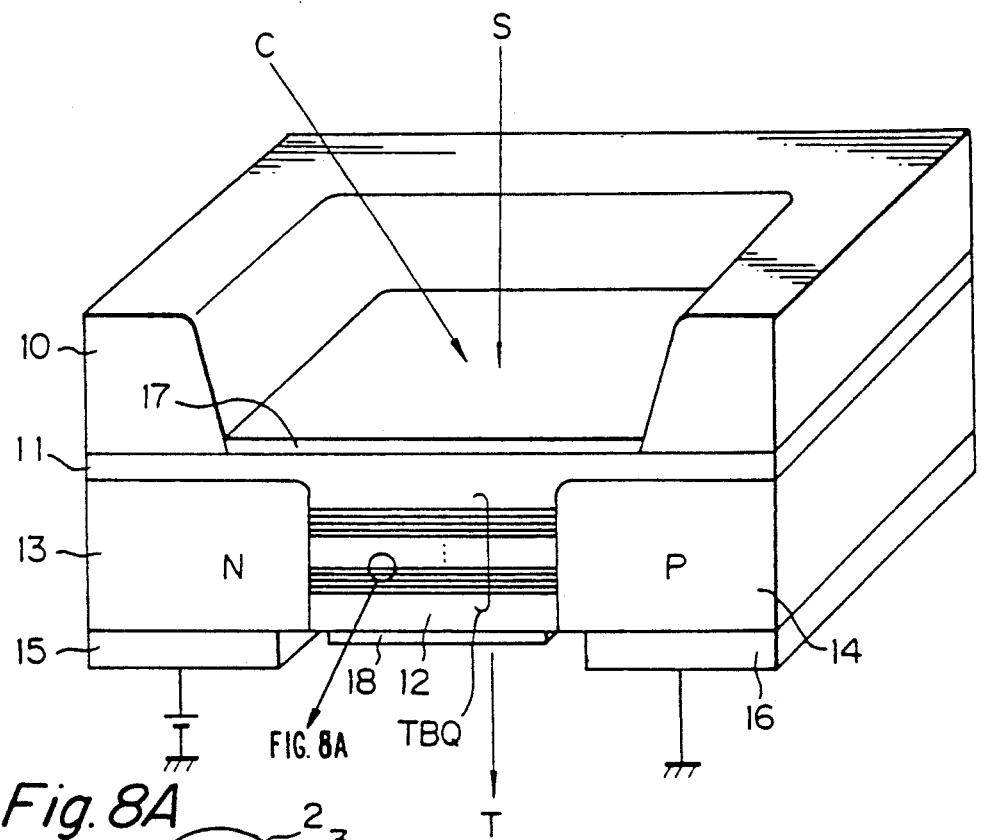
FIGS. 8 and 8A are cross-sectional view illustrating a second embodiment of the optosemiconductor device according to the present invention.
Figure 8A:
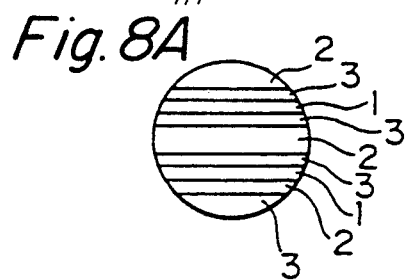

In FIGS. 8 amd 8A, which are a second embodiment of the present invention, metal film layers 17 and 18 are added to the optosemiconductor device of FIG. 5. The metal film layers 17 and 18 are made of 20 nm thick aluminum, for example, and therefore, are semitransparent. The metal film layer 17 is formed on the AlGaAs buffer layer 11 and the metal film layer 18 is formed on the AlGaAs protection layer 12, and therefore, the TBQ configuration associated with the metal film layers 17 and 18 forms a Fabry-Perot etalon, to increase the signal-to-noise ratio.

Figure 9:
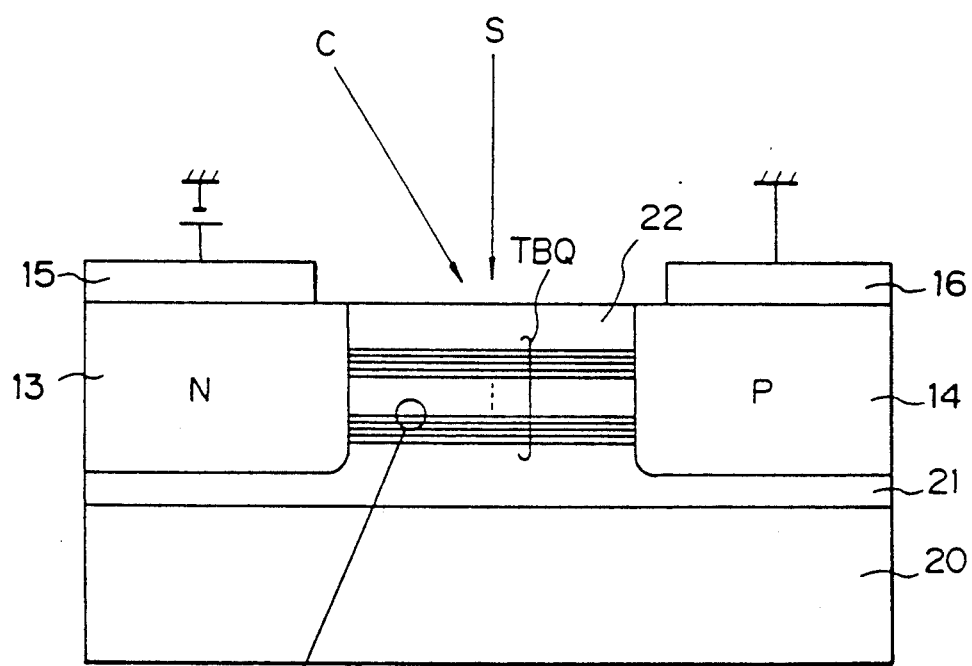
FIGS. 9 and 9A are cross-sectional views illustrating a third embodiment of the optosemiconductor device according to the present invention.
Figure 9A:
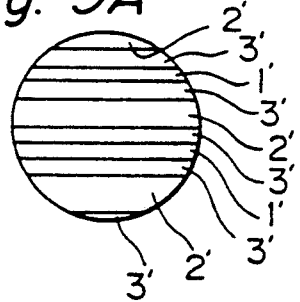

In FIGS. 9 and 9A, which are a third embodiment of the present invention, the optosemiconductor device of FIG. 5 is modified. That is, a semi-insulating InP substrate 20, an InP buffer layer 21, and an InP protection layer 22 are provided instead of the semi-insulating GaAs substrate 10, the AlGaAs buffer layer 11, and the AlGaAs protection layer 12, respectively, of FIG. 5. Note that the InP substrate 20 is transparent, and therefore, an opening for radiating the light beams C and S is not provided in the InP substrate 20.

Also, in the TBQ configuration, a 4.4 nm thick InGaAs narrow quantum well 1', an 8.8 nm thick InGaAs wide quantum well 2', and a 4.1 nm thick InP potential barrier 3'are provided instead of the GaAs narrow quantum well 1, the GaAs wide quantum well 2, and the AlGaAs potential barrier 3, respectively, of FIG. 5.

Figure 10:
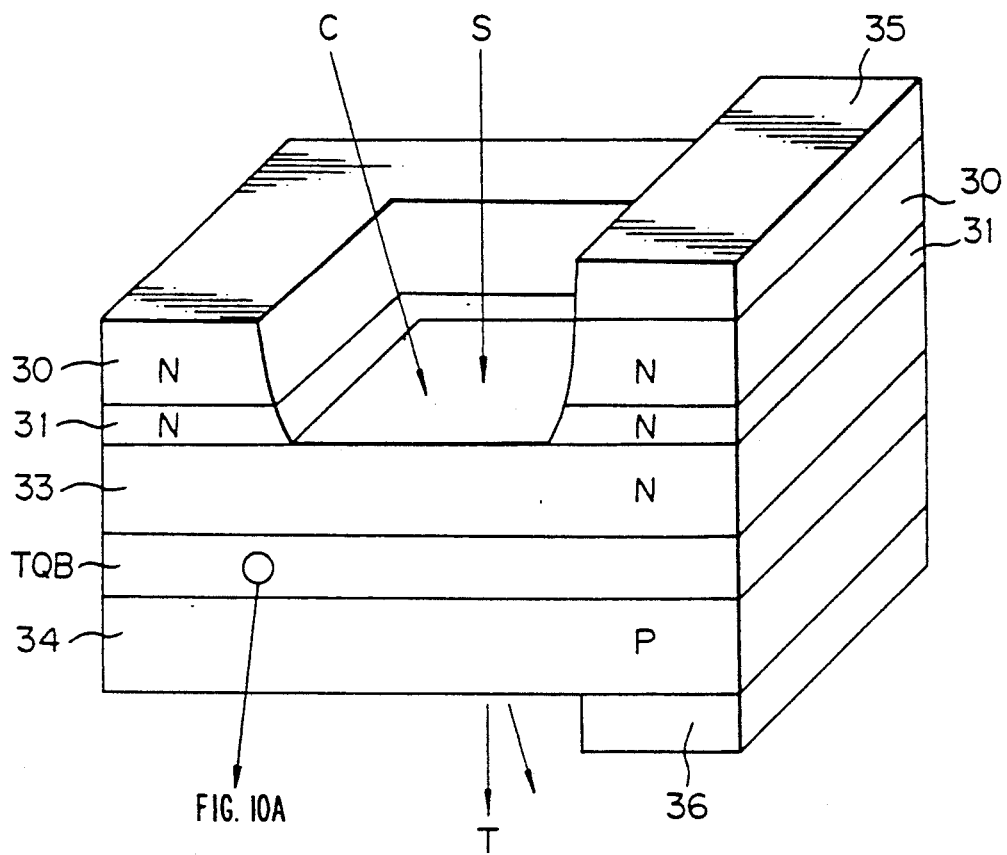
FIGS. 10 and 10A are cross-sectional views illustrating a fourth embodiment of the optosemiconductor device according to the present invention.
Figure 10A:
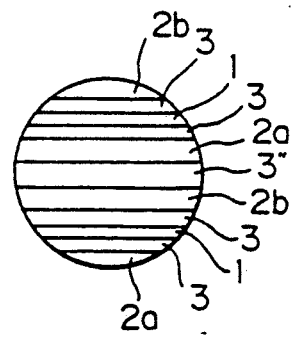

In FIGS. 10 and 10A, which are a fourth embodiment of the present invention, reference numeral 30 designates an N-type GaAs substrate, and 31 designates an N-type GaAs buffer layer. In both of the N-type GaAs substrate 30 and the N-type GaAs buffer layer 31, an opening is formed to allow a radiation of light beams C and S. Reference numerals 33 and 34 designate an N-type AlGaAs layer and a P-type AlGaAs layer. A TBQ configuration is sandwiched by the N-type and P-type AlGaAs layers 33 and 34.

In the TBQ configuration in FIG. 10, the wide GaAs quantum well 2 of FIG. 5 is split into a 9.0 nm thick GaAs quantum well 2a and a 10.0 nm thick GaAs quantum well 2b with an additional 10.0 nm AlGaAs potential barrier 3" therebetween. This additional AlGaAs potential barrier 3" is thicker than the AlGaAs potential barrier 3. Note that, instead of the thickness of the additional potential barrier 3", the composition ratio X in $Al_xGa_{1-x}Al$ can be increased to increase the barrier height thereof.

The TBQ configuration consists of 120 periods of the 4.5 nm GaAs narrow quantum well 1, the 4.0 nm thick potential barrier 3, the 9.0 nm GaAs quantum well 2a, the 10 nm thick potential barrier 3", the 10.0 nm GaAs quantum well 2b, and the 4.0 nm thick potential barrier 3.

An AuGe/Au electrode layer 35 is deposited on the N-type GaAs substrate 30, and an Au/Zn/Au electrode layer 36 is deposited on the P-type AlGaAs layer 34.

In FIG. 11A, which is an energy band diagram of the optosemiconductor device of FIG. 10 where no voltage is applied to the electrodes 35 and 36, the potential barrier 3, which has a small height, is located between the narrow quantum well 1 and the wide quantum well 2a (or 2b), and the potential barrier 3", which has a large height, is located between the wide quantum wells 2a and 2b. Therefore, a tunneling phenomenon occurs in the potential barrier 3, but no tunneling phenomenon occurs in the potential barrier 3".

In FIG. 11B, which is an energy band diagram of the optosemiconductor device of FIG. 10 where a positive voltage is applied to the electrode layer 35 and a negative voltage (or the ground level) is applied to the electrode 36, there is no interaction between electrons in the wide quantum well 2a tunneled from the narrow quantum well 1 and holes in the wide quantum well 2b tunneled from the narrow quantum well 1, due to the presence of the large height potential barrier 3".

Figure 11C:
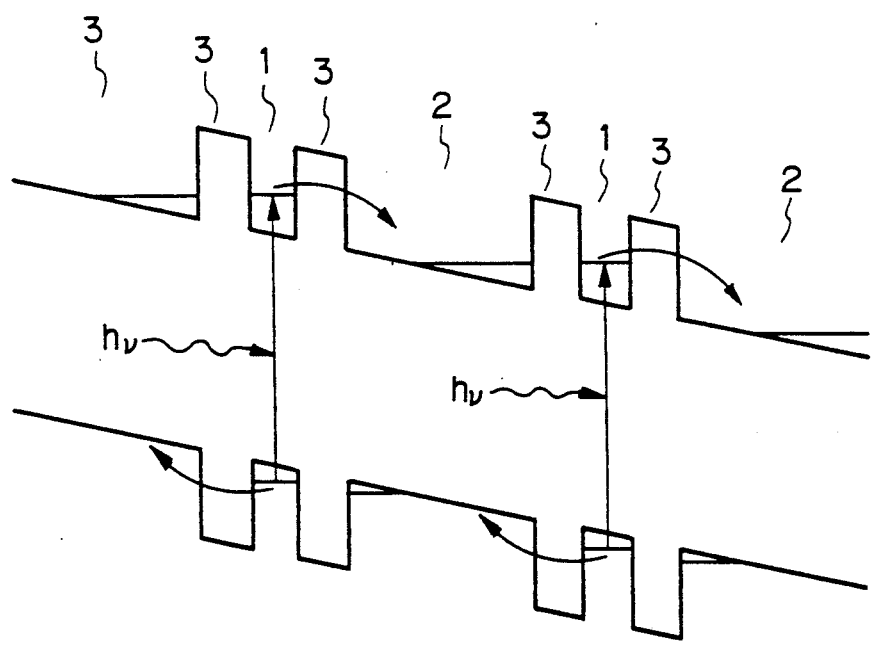

Note, if the potential barrier 3" is not present, the energy band diagram of FIG. 11B is as shown in FIG. 11C. Namely, electrons in the wide quantum well 2 interact with holes in the wide quantum well 2; this is called an avalanche phenomenon. The large height potential barrier 3" of FIG. 10 eliminates the occurrence of such an avalanche phenomenon.

Also, the width of the wide quantum well 2a is adjusted so that the difference between the ground energy level of electrons of the narrow quantum well 1 and the ground energy level of electrons of the wide quantum well 2a is the same as the energy of phonons in the potential barrier 3, to easily cause tunneling of electrons through the potential barrier 3. Similarly, the width of the wide quantum well 2b is adjusted so that the difference between the ground energy level of holes of the narrow quantum well 1 and the ground energy level of holes of the wide quantum well 2b is the same as the energy of phonons in the potential barrier 3, to easily cause a tunneling of holes through the potential barrier 3.

Also, the N-type region (30, 31, 33), the TBQ configuration, and the P-type region (34) form a PIN configuration, to thereby bend the energy band within the TBQ configuration without applying an electric field thereto, and thus the tunneling of electrons and holes toward the wide quantum wells 2a and 2b can be accelerated by using such a PIN configuration.

Figure 12:
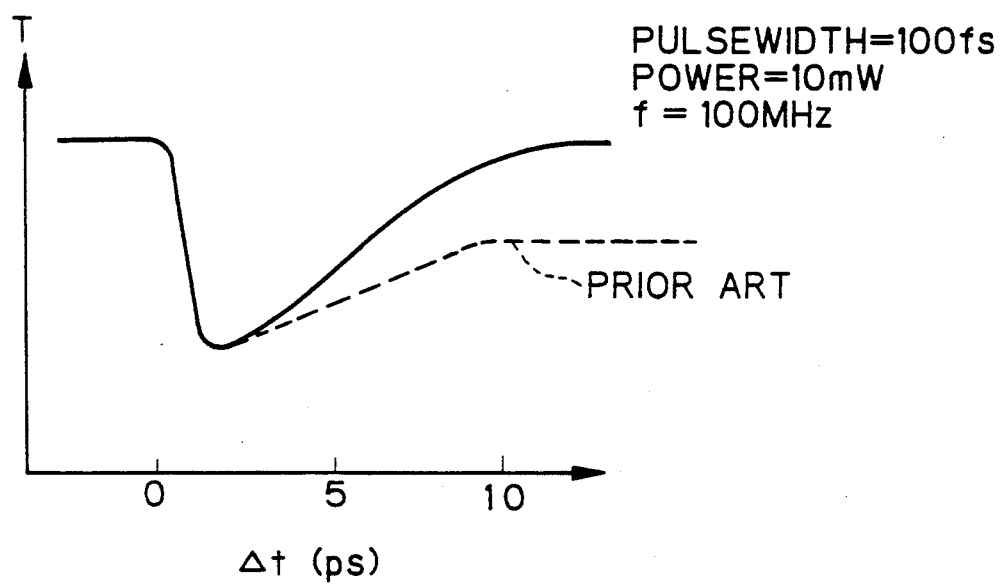
FIG. 12 is a graph showing a recovery time of the device of FIG. 10.

The recovery time when using the optosemiconductor device of FIG. 10 is improved for a high power of the control light beam C such 10 mV as shown in FIG. 12.

The optosemiconductor device of FIG. 10 is manufactured by the crystal growth of the N-type GaAs buffer layer 31, the N-type AlGaAs layer 33, the TBQ configuration, and the P-type AlGaAs protection layer 34 on the N-type GaAs substrate 30 using the MBE method. Note that the TBQ configuration can also be formed by using the MOCVD method. Also, silicon (Si) is used as dopants for the N-type AlGaAs layer 33, and beryllium (Be) is used as dopants for the P-type AlGaAs layer 34.

Next, the N-type GaAs substrate 30 and the N-type GaAs buffer layer 31 are selectively chemical-etched to partially expose the N-type AlGaAs layer 33, and then a metal such as AuGe/Au or Au/Zn/Au is deposited on the N-type GaAs substrate 30 and the P-type AlGaAs layer 36 to obtain the electrode layers 35 and 36, thus completing the device of FIG. 10.

Therefore, according to the fourth embodiment of FIG. 10, the tunneling of electrons and holes of the excitons in the narrow quantum well 1 is easily caused, and the direction of the tunneling of electrons is opposite to that of the tunneling of holes. Further, the tunneled electrons do not affect the tunneled holes due to the large height potential barrier 3", since no avalanche phenomenon occurs in the wide quantum wells.

Figure 13:
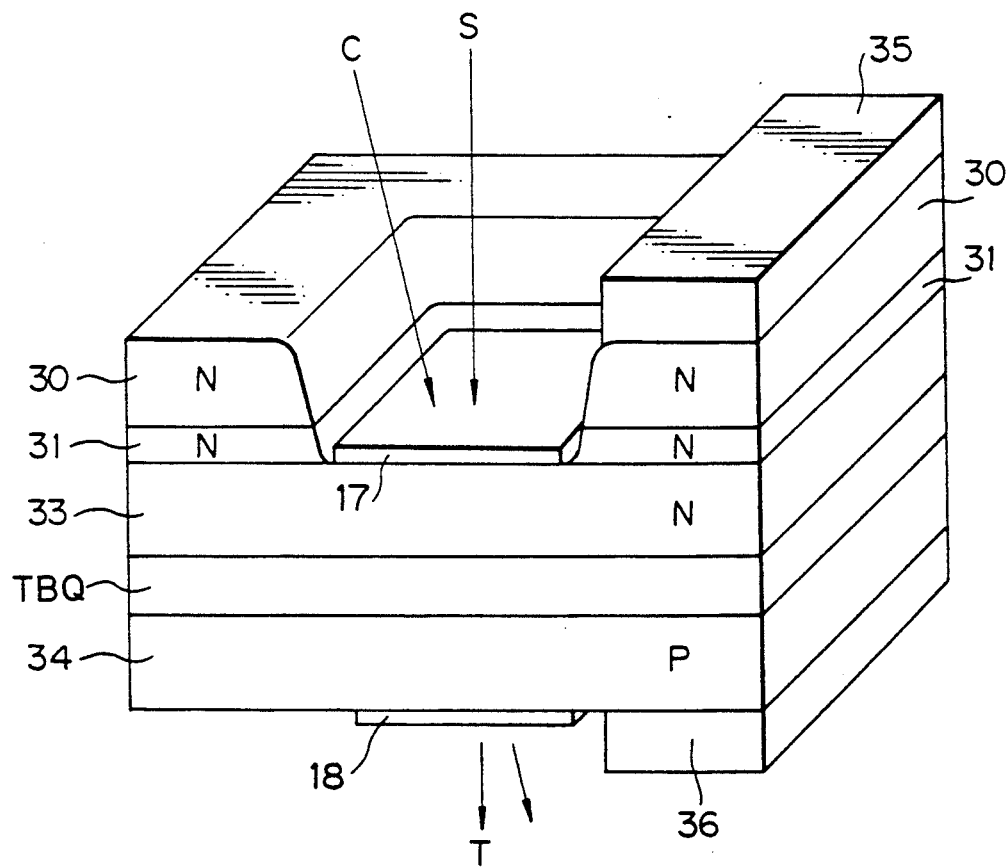
FIG. 13 is a perspective, cross-sectional view illustrating a fifth embodiment of the optosemiconductor device according to the present invention.

In FIG. 13, which is a fifth embodiment of the present invention, the semitransparent metal film layers 17 and 18 of FIG. 8 are added to the optosemiconductor device of FIG. 10. The metal film layer 17 is formed on the N-type AlGaAs buffer layer 33 and the metal film layer 18 is formed on the P-type AlGaAs layer 34, and therefore, the TBQ configuration associated with the metal film layers 17 and 18 forms a Fabry-Perot etalon, to increase the signal-to-noise ratio.

Figure 14:
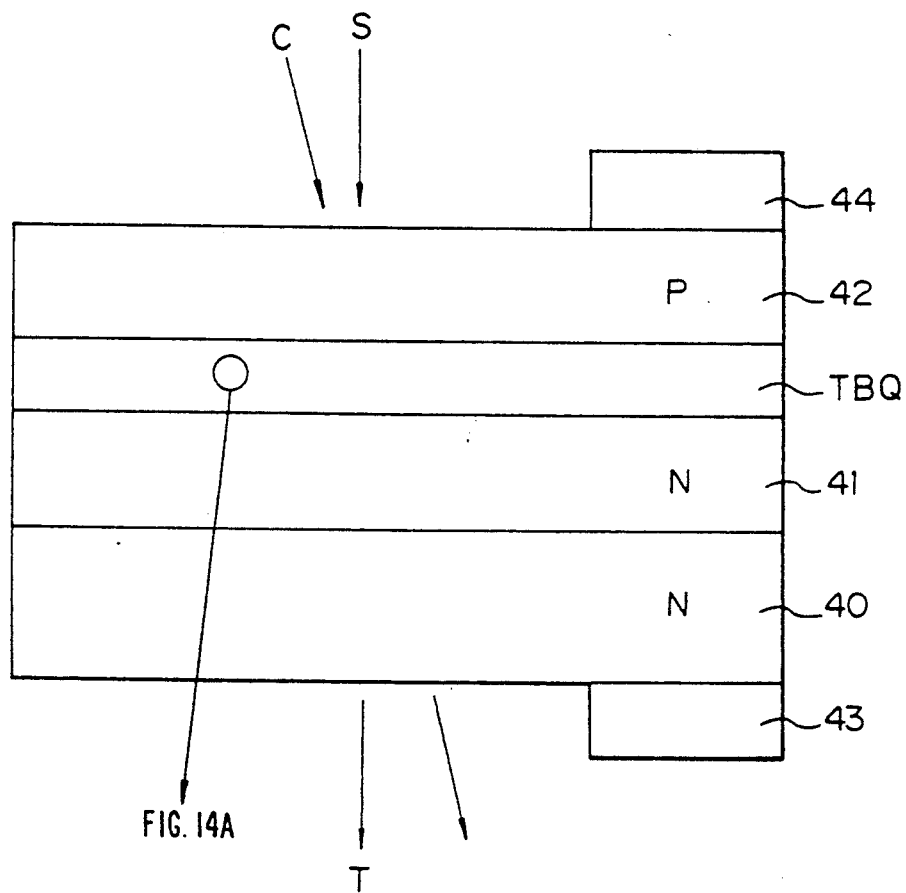
FIGS. 14 and 14A are cross-sectional views illustrating a sixth embodiment of the optosemiconductor device according to the present invention.
Figure 14A:
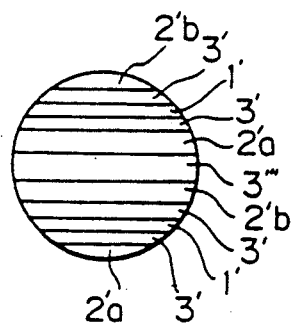

In FIGS. 14 and 14A, which are a sixth embodiment of the present invention, the optosemiconductor device of FIG. 10 is modified. Namely, an N-type InP substrate 40, an N-type InP layer 41, and a P-type InP layer 42 are provided instead of the N-type GaAs substrate 30, the N-type GaAs buffer layer 31, and the P-type AlGaAs layer 34, respectively, of FIG. 10. Note that the N-type InP substrate 40 is transparent, and 10 therefore, an opening for radiating the light beams C and S is not provided in the N-type InP substrate 40. The device of FIG. 14 also includes electrodes 43 and 44.

Also, in the TBQ configuration, a 4.4 nm thick InGaAs narrow quantum well 1', an 10.0 nm thick InGaAs wide quantum well 2'a, a 8.8 nm thick InGaAs wide quantum well 2'b, a 4.1 nm thick InP potential barrier 3', and a 10 nm thick InP potential barrier 3", are provided instead of the GaAs narrow quantum well 1, the GaAs wide quantum well 2a and 2b, and the AlGaAs potential barrier 3 and 3", respectively, of FIG. 10.

Figure 15:
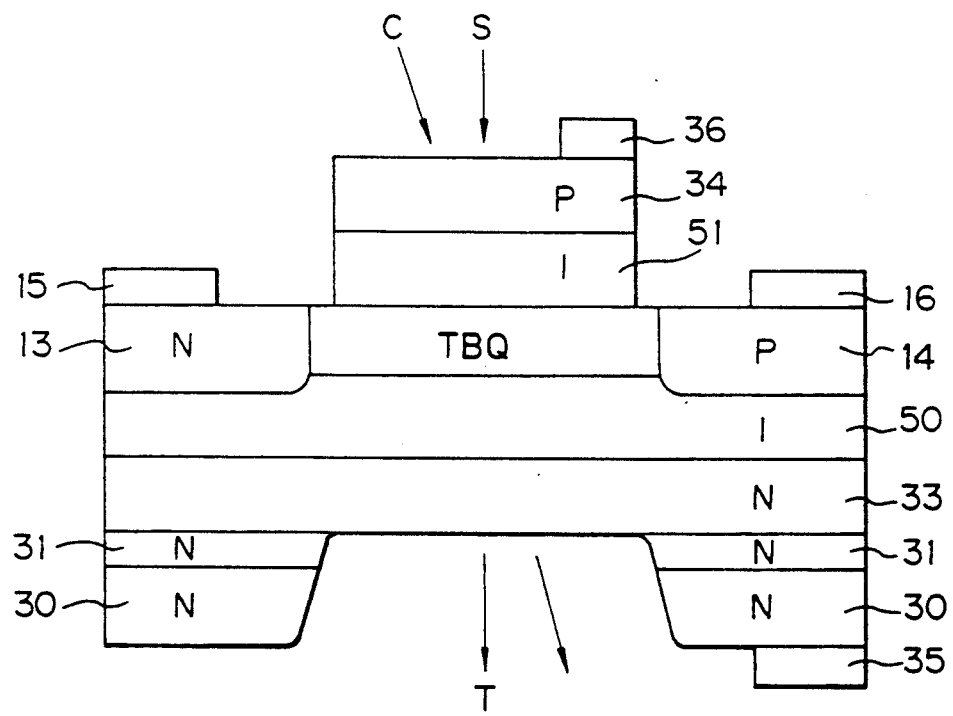
FIG. 15 is a cross-sectional view illustrating a seventh embodiment of the optosemiconductor device according to the present invention.

In FIG. 15, which is a seventh embodiment of the present invention, the device of FIG. 5 and the device of FIG. 10 are combined. Namely, an I-type AlGaAs layer 50 is inserted between the TBQ configuration and the N-type AlGaAs layer 33, and an I-type AlGaAs layer 51 is inserted between the TBQ configuration and the P-type AlGaAs layer 34. The I-type AlGaAs layers 50 and 51 are provided for electrically isolating the N-type AlGaAs layer 33, the P-type AlGaAs layer 34, the N-type contact region 13, and the P-type contact region 14 from each other. In FIG. 15, however, the I-type AlGaAs layer 51 can be omitted, since the P-type AlGaAs layer 34 can be isolated from the N-type and P-type contact regions 13 and 14 without the I-type AlGaAs layer 51.

The optosemiconductor device of FIG. 15 is manufactured by the crystal growth of the N-type GaAs buffer layer 31, the N-type AlGaAs layer 33, the I-type AlGaAs layer 50, the TBQ configuration, the I-type AlGaAs layer 51, and the P-type AlGaAs layer 34 on the N-type GaAs substrate 30, by the MBE method at a temperature of 600° C.

Next, a patterning operation is performed upon the P-type AlGaAs layer 34, and an etching operation using hydrofluoric acid is performed thereon, whereby the shape of the P-type AlGaAs layer 34 and the I-type AlGaAs layer 51 is obtained as shown in FIG. 15. In this case, the I-type AlGaAs layer 51 is not completely etched, to prevent an etching of the TBQ configuration.

The N-contact region 13 and the P-contact region 14 are manufactured in the same way as in the device of FIG. 5. Also, the electrode layers 35 and 36 are manufactured in the same way as in the device of FIG. 10. The device of FIG. 15 also includes the electrode layers 15 and 16.

Another method of manufacturing the optosemiconductor device of FIG. 15 is carried out by doping dopants using focused ion beams after the formation of the N-type GaAs buffer layer 31, the N-type AlGaAs layer 33, the I-type AlGaAs layer 50, and the TBQ configuration. Next, the I-type AlGaAs layer 51 and the P-type AlGaAs layer 34 are grown thereon, and then an annealing operation is performed thereon to obtain the N-type contact region 13 and the P-type contact region 14. Thereafter, the P-type AlGaAs layer 34 and the I-type AlGaAs layer 51 are selectively etched to expose parts of the surfaces of the N-type contact region 13 and the P-type contact region 14.

Figure 16:
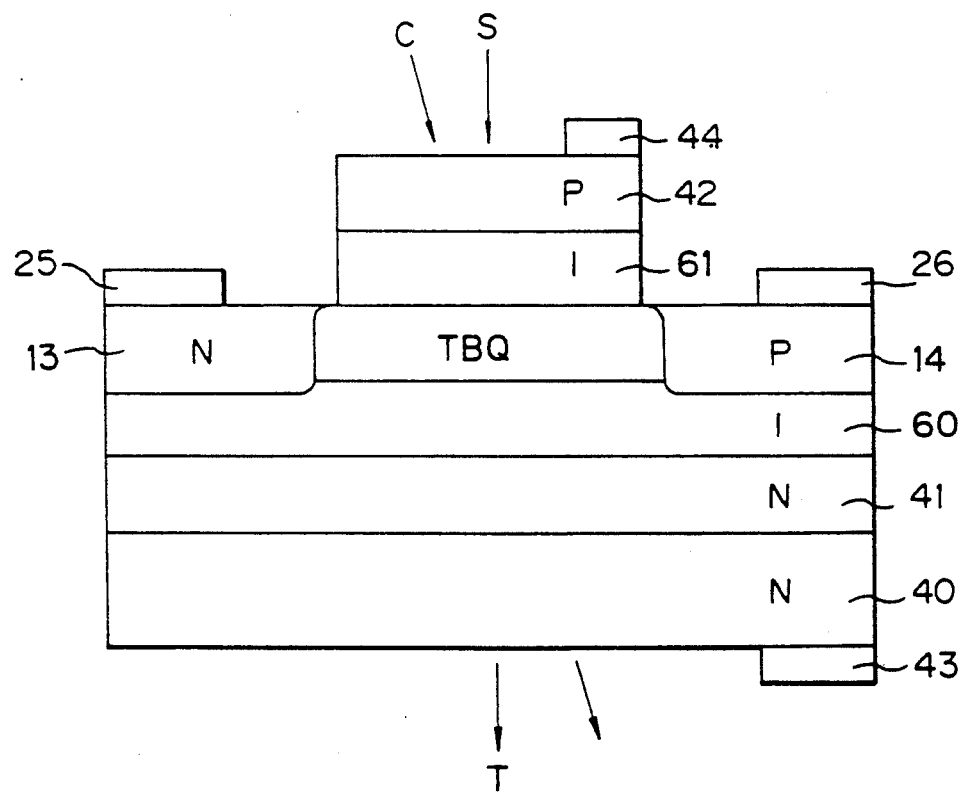
FIG. 16 is a perspective, cross-sectional view illustrating an eighth embodiment of the optosemiconductor device according to the present invention.

In FIG. 16, which shows an eighth embodiment of the present invention, the device of FIG. 9 and the device of FIG. 14 are combined. Also, in the same way as the I-type AlGaAs layers 50 and 51 of FIG. 15, I-type InP layers 60 and 61 are provided for electrically isolating the N-type InP layer 41, the P-type InP layer 42, the N-type contact region 13, and the P-type contact region 14 from each other. Also, in FIG. 16, the I-type InP layer 61 can be omitted, since the P-type InP layer 42 can be isolated from the N-type and P-type contact regions 13 and 14 without the I-type InP layer 61. The device of FIG. 16 also includes an N-type InP substrate 50 and the electrode layers 25, 26, 43 and 44.

The optosemiconductor device of FIG. 16 is manufactured in the same way as in the manufacture of the device of FIG. 15, except that the P-type InP layer 42 and the I-type InP layer 61 are etched by using bromomethane.

In FIGS. 9, 14, 15, and 16, a Fabry-Perot etalon configuration can also be added.

Figure 17:
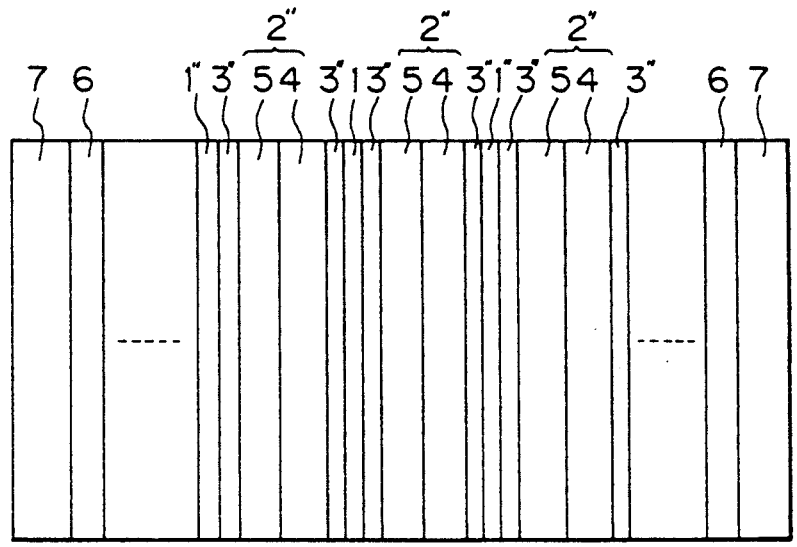
FIG. 17 is a perspective, cross-sectional view illustrating a ninth embodiment of the optosemiconductor device according to the present invention.

In FIG. 17, which is a ninth embodiment of the present invention, reference numeral $1''$ designates a 4.0 nm thick $In_{1-x}Ga_xAl_{1-y}Sb_y$ (x=y=0.5) narrow quantum well, $2''$ an InAs wide quantum well, and $3''$ a 2.5 nm thick AlSb potential barrier for sandwiching the narrow quantum well $1''$ and the wide quantum well $2''$.

A TBQ configuration consists of 80 periods of the narrow quantum well $1''$, the potential barrier $3''$, the wide quantum well $2''$, and the potential barrier $3''$.

The wide quantum well $2''$ is further comprised of a 10.0 nm thick InAs layer 4 and a 8.0 nm thick GaSb layer 5 which form a broken gap type heterojunction.

Also, a 10.0 nm thick $In_{1-z}Al_zSb$ (z=0.5) cap layer 6 and a 20.0 nm thick mirror layer 7 as an optical mirror are provided on both sides of the TBQ configuration, to form a Fabry Perot etalon.

Figure 18:
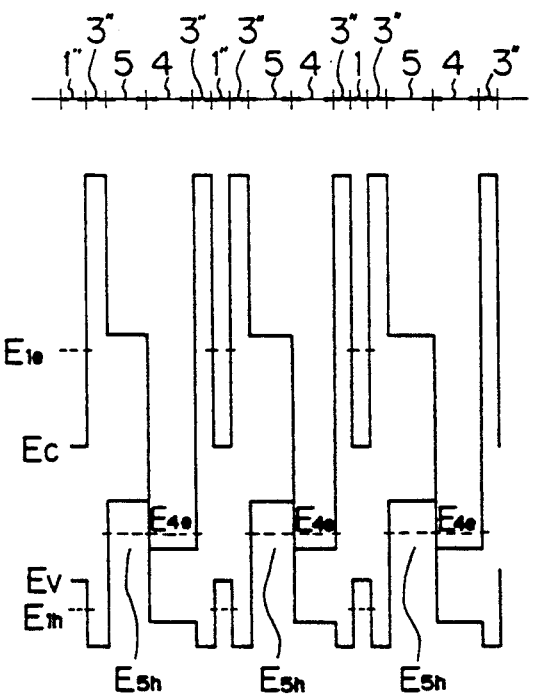
FIG. 18 is a energy band diagram of the device of FIG. 17.

An energy band of the TBQ configuration of FIG. 17 is shown in FIG. 18. A first quantum energy level (ground level) $E_{1e}$ of electrons of the narrow quantum well $1''$, which level is 229 meV, is higher than a first quantum energy level (ground level $E_{4e}$ of electrons of the wide quantum well $2''$, i.e., the InAs layer 4, and thus electrons are tunneled through the potential barrier $3''$ toward the wide quantum well $2''$. Similarly, a first quantum energy level (ground level $E_{1h}$ of light holes of the narrow quantum well $1''$, which level is 30 meV, is higher than a first quantum energy level (ground level) $E_{5h}$ of holes of the wide quantum well $2''$, i.e., the GaSb layer 5, and thus holes are tunneled through the potential barrier $3''$ toward the wide quantum well $2''$.

Further, in the wide quantum well $2''$, the first quantum energy level $E_{4e}$ of electrons of the InAs layer 4 is approximately the same as the first quantum energy level $E_{5h}$ of holes of the GaSb layer 5 at the interface of the broken gap type heterojunction. Namely, the conduction band of the InAs layer 4 is superimposed on the valence band of the GaSb layer 5, and therefore, a wavefunction of electrons in the InAs layer 4 is superimposed on a wavefunction of light holes in the GaSb layer 5.

In this case, even when the level $E_{5h}$ is higher than the level $E_{4e}$, electrons in the InAs layer 4 can be combined with holds i the GaSb layer 5. Conversely, when the level $E_{5h}$ is lower than the level $E_{4e}$, electrons in the InAs layer 4 cannot be combined with holes in the GaSb layer 5.

Note that the first quantum energy level $E_{1e}$ of the narrow quantum well $1''$ is lower than a lower end of an indirect transition band of the potential barrier $3''$; this indirect transition band is not shown in FIG. 18.

Figure 19:
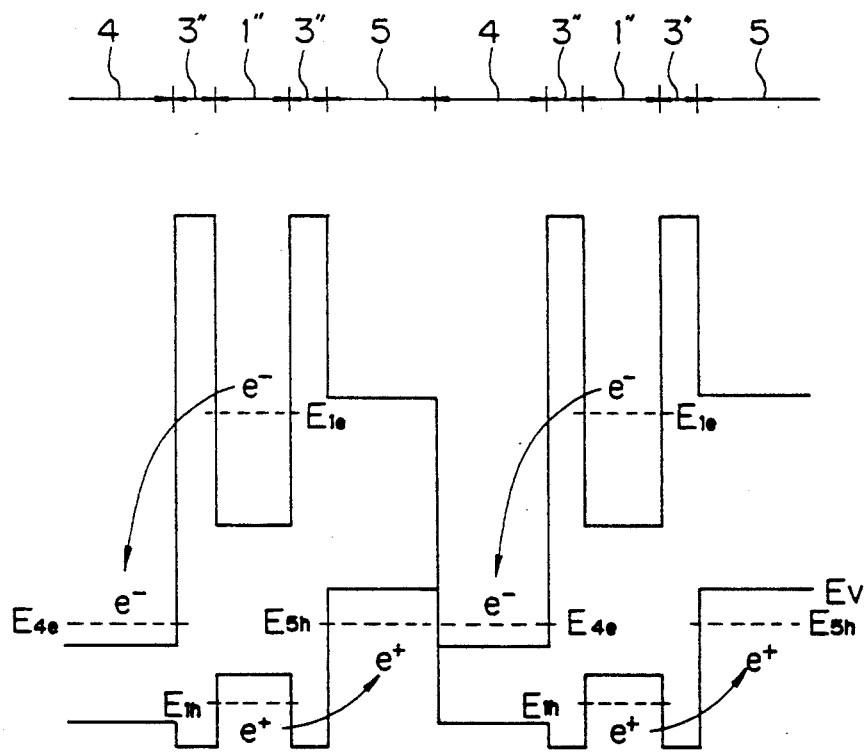
FIG. 19 is a energy band diagram explaining the operation of the device of FIG. 17.

The operation of the TBQ configuration of FIG. 17 will be explained with reference to FIG. 19. Electrons of photo-excited carriers (excitons) at the first quantum energy level $E_{1e}$ of electrons of the narrow quantum well $1''$ are tunneled via the potential barrier $3''$ to the first quantum energy level $E_{4e}$ of the InAs layer 4. Simultaneously, holes of photo-excited carriers (excitons) at the first quantum energy level $E_{1h}$ of holes of the narrow quantum well $1''$ are tunneled via the potential barrier $3''$ to the first quantum energy level $E_{5h}$ of the GaSb layer 5. The tunneled electrons at the first quantum energy level $E_{4e}$ of electrons of the InAs layer 4 are recombined at once with the tunneled holes at the first quantum energy $E_{5h}$ of holes of the GaSb layer 5, due to the broken gap type heterojunction and thus the recovery time when using the optosemiconductor device of FIG. 18 is improved for a high power of the control light beam C such as 10 mW, as shown in FIG. 20.

The steps of manufacturing the optosemiconductor device of FIG. 17 will be explained below with reference to FIGS. 21A and 21B.

Figure 21A:
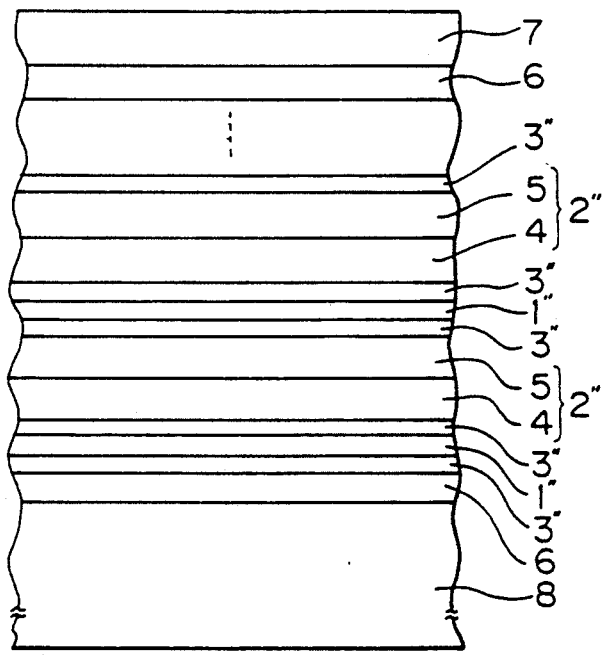
FIGS. 21A and 21B are cross-sectional views explaining the manufacture of the device of FIG. 17.

As illustrated in FIG. 21A, the 10 nm thick InAlSb cap layer 6 and the TBQ configuration are grown as crystals on an InAs (001) substrate 8 by the MBE method. In this case, the 2.5 nm thick AlSb potential barrier $3''$, the 4.0 nm InGaAsSb narrow quantum well $1''$, the 2.5 nm thick AlSb potential barrier $3''$, the 10 nm thick InAs layer 4, the 8.0 nm thick GaSb layer 5, and the 2.5 nm thick AlSb potential barrier $3''$ are repeated 80 times, to form the TBQ configuration.

Again, the 10 nm InAlSb cap layer 6 is formed, and the mirror layer 7 of 20 nm thick Au is evaporation-deposited thereon, to complete the device of FIG. 21A.

Figure 21B:
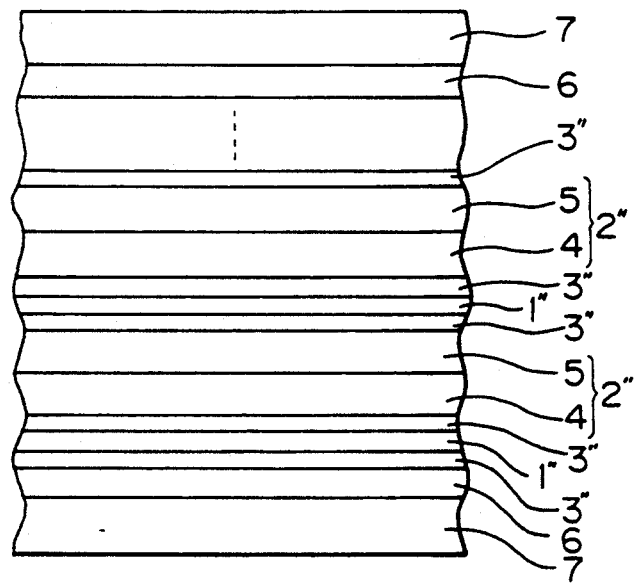

Then, the InAs substrate 8 is removed by etching, and thereafter, the mirror layer of 20 nm thick Au is evaporation-deposited thereon, to thus obtain the device of FIG. 21B.

Figure 22:
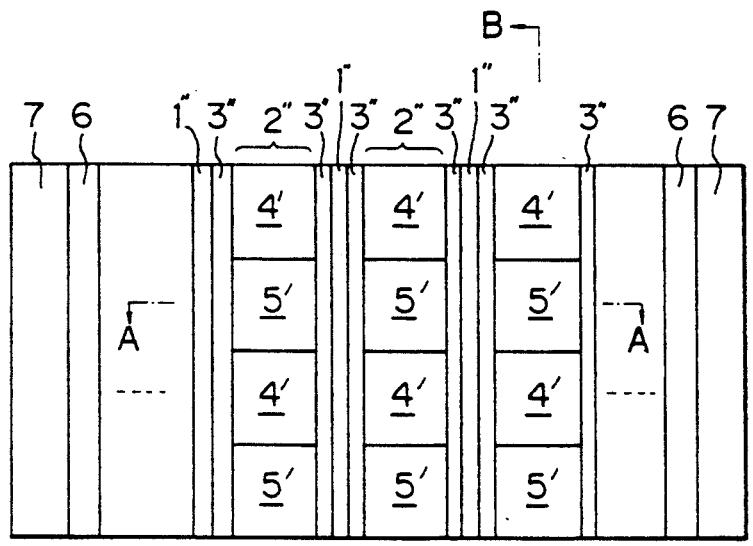
FIG. 22 is a cross-sectional view illustrating a tenth embodiment of the optosemiconductor device according to the present invention.
Figure 23A:
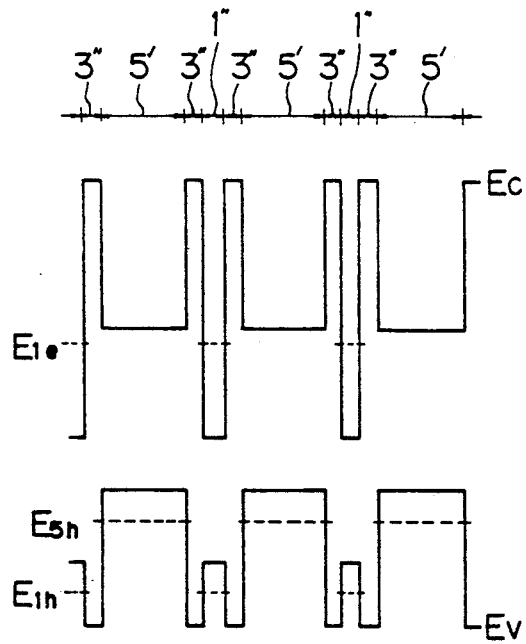
FIGS. 23A and 23B are energy band diagrams taken along the lines A—A and B—B, respectively, of FIG. 22.
Figure 23B:
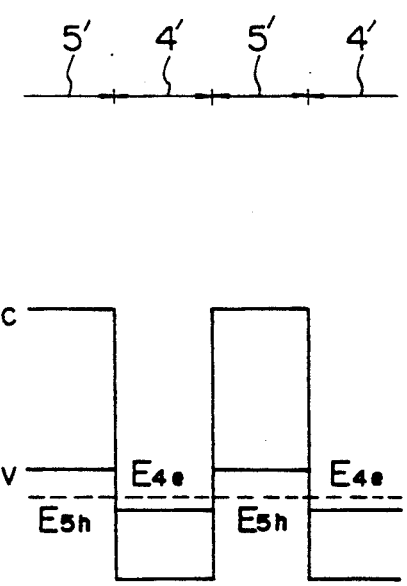

FIG. 22 illustrates a tenth embodiment of the present invention, and FIGS. 23A and 23B are energy band diagrams of the device of FIG. 22 taken along the lines A—A and B—B, respectively, thereof.

As illustrated in FIGS. 22, 23A, and 23B, an InAs layer 4' and a GaSb layer 5', which form a broken gap type heterojunction, are arranged alternately and in parallel with a stacked face of the TBQ configuration. Note, the operation of the optosemiconductor device of FIG. 22 is the same as that of the optosemiconductor device of FIG. 17.

The steps of manufacturing the optosemiconductor device of FIG. 22 will be explained below with reference to FIGS. 24A, 24B, and FIGS. 25A through 25E.

Figure 24A:
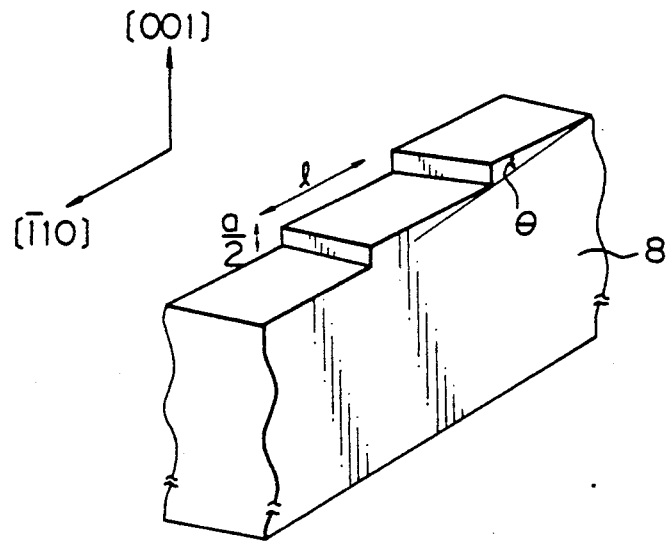
FIG. 24A, 24B, and FIGS. 25A through 25E are cross-sectional views explaining the manufacture of the device of FIG. 22.
Figure 24B:
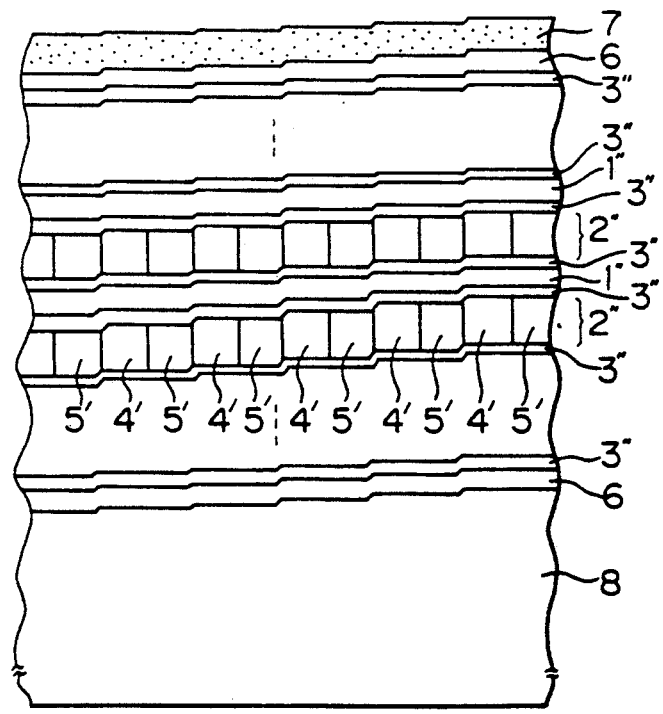

First, as illustrated in FIG. 24A, an InAs (001) substrate 8 is ground to obtain a sloped surface having an angle of $\theta(=0.5°)$ with respect to a direction [$\bar{1}10$]. As a result, a slope formed by steps, each of which has a difference a/2 (a is a lattice constant) and a length 1 (=34.7 nm), is obtained.

Next, the 10 nm thick InAlSb cap layer 6, the 2.5 nm thick AlSb potential barrier 3", the 4.0 nm thick InGaAsSb quantum well 1", and the 2.5 nm thick AlSb potential barrier 3" are deposited, in this sequence, on the InAs substrate 8.

Figure 25A:
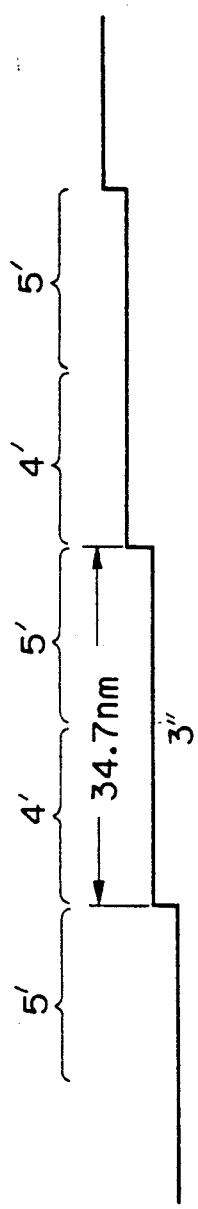
Figure 25B:
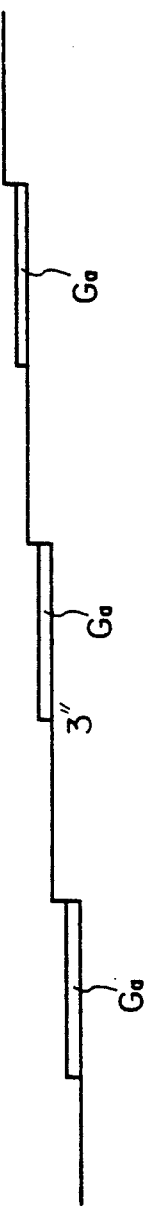
Figure 25C:
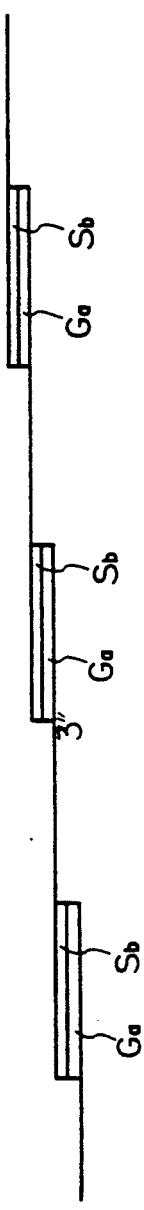
Figure 25D:
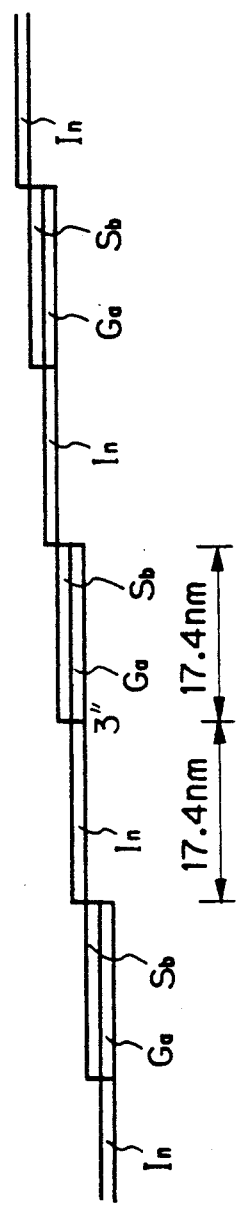
Figure 25E:
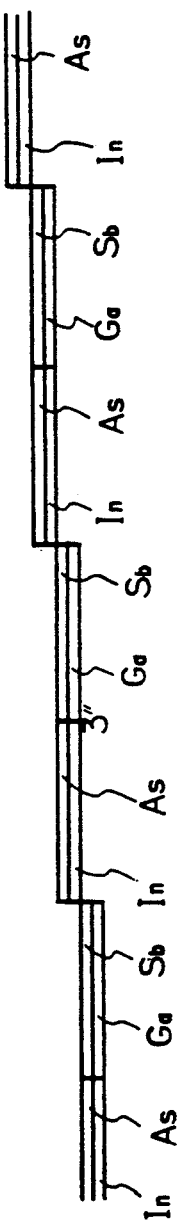

Next, the InAs/GaSb quantum well 2" is deposited on the AlSb potential barrier 3" by a step flow mode, as illustrated in FIGS. 25A through 25E. Namely, the surface of the InAs substrate 8, i.e., the surface of the AlSb potential barrier 3", is sloped at an angle of 0.5°, and a step distance for one molecular layer is 34.7 nm, as illustrated in FIG. 25A. In this state, Ga is deposited thereon by the MBE method, to obtain a 17.4 nm distance molecular layer of Ga, as illustrated in FIG. 25B. Next, if Sb is deposited thereon by the MBE method, Sb is deposited on only the Ga molecular layer, as illustrated in FIG. 25C. Thereafter, In is deposited thereon by the MBE method, to obtain a 17.4 nm distance molecular layer of In, as illustrated in FIG. 25D. Next, if As is deposited thereon by the MBE method, As is deposited on only the In molecular layer as illustrated in FIG. 25E. The above-mentioned process is repeated to simultaneously obtain the InAs layer 4' and the GaSb layer 5', each of which is 10 nm thick.

Note that the angle $\theta$ and the length ratio of the InAs layer 4' to the GaSb layer 5' can be adjusted in accordance with the quantum energy levels of the quantum wells 4 and 5, and the quantum energy levels of the narrow quantum well 1" and the potential barrier 3".

Then, a period of the narrow quantum well 1", the potential barrier 3", the wide quantum well 2" (the quantum wells 4' and 5'), and the potential barrier 3" is repeated 80 times to obtain the TBQ configuration. Thereafter, the 10 nm thick InAlSb cap layer 6 is formed, and further, the mirror layer 7 of 20 nm Au is evaporation-deposited thereon, to obtain the device of FIG. 24B. Note that the InAs substrate 8 is removed by etching, and the mirror layer 7 is evaporation-deposited on the InAlSb cap layer 6.

Also, in the devices of FIGS. 17 and 22, the thickness of the InGaAsSb narrow quantum well 1" is 4.0 nm, but this thickness can be arbitrarily selected, under the condition that the ground quantum energy $E_{1e}$ of electrons of the narrow quantum well 1" is higher than the ground quantum energy level $E_{4e}$ of electrons of the quantum well 4 (or 4'), and that the ground quantum energy $E_{1h}$ of holes of the narrow quantum well 1" is higher than the ground quantum energy level $E_{5h}$ of holes of the quantum well 5 (or 5'), and under the condition that the ground energy level $E_{1e}$ of electrons is lower than the lower edge of an indirect transition band of the potential barrier 3".

Further, the materials for the broken gap heterojunction can be made of InAs and $GaAs_{1-x}Sb_x$, in combination, on an InAs substrate or $InAs_{1-y}Sb_y$ and GaSb, in combination, on a GaSb substrate.

Further, the electric field applying means as illustrated in FIGS. 5, 9, 10, and 14 can be combined with the optosemiconductor devices of FIGS. 17 and 22.

According to the present invention, since a remaining of tunneled carriers in the wide quantum wells can be eliminated, the absorption (or transmission) can be rapid recovered.

We claim:

1. An optosemiconductor device comprising:
    a superlattice configuration of a first quantum well layer, a second quantum well layer thicker than said first quantum well layer, and a potential barrier layer therebetween, said potential barrier layer having a thickness thereby inviting a tunneling phenomenon, photo-excited carriers generated in a first quantum well layer being tunnelled through said potential barrier layer toward said second quantum well layer so that the tunneled carriers are accumulated in said second quantum well layer; and
    means for applying an electric field to said superlattice configuration to expel the tunneled carriers from said second quantum well layer, said electric field applying means being arranged to apply said electric field in a direction which is parallel to a stacked face of said superlattice configuration.

2. A device as set forth in claim 1, wherein said electric field applying means comprises:
    an N-type contact region formed on one side of said superlattice configuration; and
    a P-type contact region formed on the other side of said superlattice configuration,
    said P-type contact region, said superlattice configuration, and said N-type contact region forming a PIN configuration.

3. A device as set forth in claim 2, wherein said electric field applying means further comprises:
    a first electrode connected to said N-type contact region;
    a second electrode connected to said P-type contact region; and
    means for applying a first voltage and a second voltage lower than said first voltage to said first and second electrodes, respectively.

4. A device as set forth in claim 1, further comprising:
    a first semitransparent metal film layer formed on one surface of said superlattice configuration; and
    a second semitransparent metal film layer formed on the other surface of said superlattice configuration,
    said superlattice configuration and said first and second metal film layers forming a Fabry-Perot etalon.

5. A device as set forth in claim 1, wherein said first quantum well layer is made of GaAs and is about 4.5 nm thick,
    said second quantum well layer being made of GaAs and being about 9.0 nm thick,
    said potential barrier layer being made of GlGaAs and being about 4.0 nm thick.

6. A device as set forth in claim 5, further comprising:
    a semi-insulating GaAs substrate having an opening for radiating a light beam thereto,
    an AlGaAs buffer layer formed on said GaAs substrate; and
    an AlGaAs protection layer,
    said superlattice configuration being sandwiched between said AlGaAs buffer layer and said AlGaAs protection layer.

7. A device as set forth in claim 1, wherein said first quantum well layer is made of InGaAs and is about 4.4 nm thick, said second quantum well layer being made of InGaAs and being about 8.8 nm thick, said second barrier layer being made of Inp and being about 4.1 nm thick.

8. A device as set forth in claim 8, further comprising:

a semi-insulating InP substrate having an opening for radiating a light beam thereto, an InP buffer layer formed on said InP substrate; and an InP protection layer, said superlattice configuration being sandwiched between said InP buffer layer and said InP protection layer.

9. An optosemiconductor device comprising:

a superlattice configuration of a first quantum well layer, a second quantum well layer thicker than said first quantum well layer, and a potential barrier layer therebetween, said potential barrier layer having a thickness thereby inviting a tunneling phenomenon, photo-excited carriers generated in said first quantum well layer being tunneled through said potential barrier layer toward said second quantum well layer so that the tunneling carriers are accumulated in said second quantum well layer; and means for applying an electric field to said superlattice configuration to expel the tunneled carriers from said second quantum well layer, said second quantum well layer being split into two quantum wells, said superlattice configuration further comprising another potential barrier layer formed between said two quantum wells to prevent the occurrence of an avalanche phenomenon therein, said electric field applying means being arranged to apply said electric field in a direction which is perpendicular to a stacked face of said superlattice configuration.

10. A device as set forth in claim 9, wherein said electric field applying means comprises:

an N-type semiconductor layer on a stacked face of said superlattice configuration; and a P-type semiconductor layer on the other stacked surface of said superlattice configuration, said P-type semiconductor layer, said superlattice configuration, and said N-type semiconductor layer forming a PIN configuration.

11. A device as set forth in claim 10, wherein said electric field applying means further comprises:

an I-type layer inserted between said N-type semiconductor layer and said superlattice configuration; and an I-type layer inserted between said P-type semiconductor layer and said superlattice configuration.

12. A device as set forth in claim 10, wherein said electric field applying means further comprises:

a first electrode connected to said N-type semiconductor region;

a second electrode connected to said P-type semiconductor region; and means for applying a first voltage and a second voltage lower than said first voltage to said first and second electrodes, respectively.

13. A device as set forth in claim 9, wherein said first quantum well layer is made of GaAs and is about 4.5 nm thick, said two quantum wells of said second quantum well layer being made of GaAs and being respectively about 9.0 nm and about 10.0 nm thick, said potential barrier layer being made of GlGaAs and being about 4.0 nm thick, said another potential barrier layer being made of AlGaAs and being about 10.0 nm thick.

14. A device as set forth in claim 13, further comprising:

an N-type GaAs substrate;

an N-type AlGaAs buffer layer on said GaAs substrate, said N-type AlGaAs buffer layer and said GaAs substrate having an opening therein for radiating a light beam therethrough;

an N-type AlGaAs layer formed on said N-type AlGaAs buffer layer; and a P-type AlGaAs layer, said superlattice configuration being sandwiched between said N-type AlGaAs layer and said P-type AlGaAs layer.

15. A device as set forth in claim 9, wherein said first quantum layer is made of InGaAs and is about 4.4 nm thick, said two quantum wells of said second quantum well layer being made of InGaAs and being respectively about 8.8 nm and about 10.0 nm thick, said potential barrier layer being made of InP and being about 4.1 nm thick, said another potential barrier layer being made of InP and being about 10.0 nm thick.

16. A device as set forth in claim 15, further comprising:

an N-type InP substrate;

an N-type InP layer on said InP substrate; and a P-type InP layer, said superlattice configuration being sandwiched between said N-type InP layer and said P-type InP layer.

17. An optosemiconductor device comprising a superlattice configuration of a first quantum well layer, a second quantum well layer, and a potential barrier layer therebetween, said potential barrier layer having a thickness thereby inviting a tunneling phenomenon, photo-excited carriers generated in said first quantum well layer being tunneled through said potential barrier layer toward said second quantum well layer, so that the tunneled carriers are accumulated in said second quantum well layer, said second quantum well layer comprising first and second quantum wells forming a broken gap type heterojunction where a lower end of a conduction band of said first quantum well is lower than a higher end of a valence band of said second quantum well, a ground quantum energy level of electrons of said first quantum well layer being higher than a ground quantum energy level of electrons of said first quantum well, a ground quantum energy level of holes of said first quantum well layer being higher than a ground quantum energy level of holes of said second quantum well, whereby the tunneled electrons in said first quantum well are recombined with the tunneled holes in said second quantum well at said broken gap type heterojunction.

18. A device as set forth in claim 17, wherein the ground quantum energy level of electrons of said first quantum well is approximately the same as the ground quantum energy level of holes of said second quantum well.

19. A device as set forth in claim 17, wherein said first and second quantum wells of said second quantum layer are laminated along a direction of lamination of said first quantum layer and said potential barrier.

20. A device as set forth in claim 19, wherein said quantum well layer is made of InGaAsSb and is about 4.0 nm thick,
   said first quantum well of said second quantum well layer being made of InAs and being about 10.0 nm thick and said second quantum well of said second quantum well layer being made of GaSb and being about 8.0 nm thick,
   said potential barrier layer being made of AlSb and being about 2.5 nm thick.

21. A device as set forth in claim 17, wherein said first and second quantum wells of said second quantum well layer are laminated in a direction which is perpendicular to the direction of lamination of said first quantum well layer and said potential barrier.

22. A device as set forth in claim 21, wherein said first quantum well layer is made of InGaAsSb and is about 4.0 nm thick,
   said first quantum well of said second quantum well layer being made of InAs and being about 17.4 nm wide and said second quantum well of said second quantum well layer being made of GaSb and being about 17.4 nm wide,
   said potential barrier layer being made of AlSb and being about 2.5 nm thick.

23. A device as set forth in claim 22, wherein said first and second quantum wells are manufactured using a step flow mode.

24. A device as set forth in claim 17, further comprising two optical mirrors sandwiching said super-lattice configuration, said superlattice configuration with said optical mirrors thereby forming a Fabry-Perot etalon.

* * * * *

UNITED STATES PATENT AND TRADEMARK OFFICE
CERTIFICATE OF CORRECTION

PATENT NO. : 5,160,993
DATED : November 3, 1992
INVENTOR(S) : HIDEAKI ISHIKAWA, YOSHIHIRO SUGIYAMA, SHUNICHI MUTO and TOSHIO FUJII It is certified that error appears in the above-identified patent and that said Letters Patent is hereby corrected as shown below:

Column 1, line 35, "wherein" should be --where--.

Signed and Sealed this

Fifth Day of October, 1993

Attest:

BRUCE LEHMAN

Attesting Officer    Commissioner of Patents and Trademarks